(12) United States Patent
Takami

(10) Patent No.: US 7,371,646 B2
(45) Date of Patent: May 13, 2008

(54) MANUFACTURE OF INSULATED GATE TYPE FIELD EFFECT TRANSISTOR

(75) Inventor: Syuusei Takami, Kagoshima-ken (JP)

(73) Assignee: Yamaha Corporation (JP)

( * ) Notice: Subject to any disclaimer, the term of this patent is extended or adjusted under 35 U.S.C. 154(b) by 61 days.

(21) Appl. No.: 11/219,567

(22) Filed: Sep. 2, 2005

(65) Prior Publication Data
US 2006/0051927 A1 Mar. 9, 2006

(30) Foreign Application Priority Data
Sep. 3, 2004 (JP) .............................. 2004-256623

(51) Int. Cl.
*H01L 21/8234* (2006.01)
(52) U.S. Cl. ...................... 438/275; 438/283; 438/303; 438/305
(58) Field of Classification Search ................ 438/275, 438/283, 287, 301, 303, 305, 306, 307
See application file for complete search history.

(56) References Cited

U.S. PATENT DOCUMENTS 5,270,233 A * 12/1993 Hamatake .................. 438/231
5,869,378 A * 2/1999 Michael ...................... 438/305

FOREIGN PATENT DOCUMENTS

| JP | 363067778 A | * | 3/1988 |
| JP | 406216149 A | * | 8/1994 |
| JP | H06-275635 | | 9/1994 |

* cited by examiner

*Primary Examiner*—Mary Wilczewski
*Assistant Examiner*—Khanh Duong
(74) *Attorney, Agent, or Firm*—Dickstein, Shapiro, LLP.

(57) ABSTRACT

After a field insulating film having an element opening is formed on the surface of a p-type well, a gate insulating film is formed on a semiconductor surface in the element opening. A gate electrode layer of polysilicon or the like is formed on the insulating film. By using as a mask a lamination of the electrode layer and gate insulating film and the field insulating film, an ion implantation process is executed to form n⁺-type source and drain regions. After the electrode layer is made narrow and thin by an isotropic etching process, n⁻-type source and drain regions are formed by an ion implantation process using as a mask the lamination of the electrode layer and gate insulating film and the field insulating film.

9 Claims, 26 Drawing Sheets

MANUFACTURE OF INSULATED GATE TYPE FIELD EFFECT TRANSISTOR

CROSS REFERENCE TO RELATED APPLICATION

This application is based on and claims priority of Japanese Patent Application No. 2004-256623 filed on Sep. 3, 2004, the entire contents of which are incorporated herein by reference.

BACKGROUND OF THE INVENTION

A) Field of the Invention

The present invention relates to a manufacture method for an insulated gate type field effect transistor having a lightly doped drain (LDD) structure.

B) Description of the Related Art

As a conventional manufacture method for an insulated gate type field effect transistor having an LDD structure, a method such as illustrated in FIG. 30 to 32 is known (for example, refer to JP-A-HEI-6-275635).

In a process shown in FIG. 30, after a field oxide film 2 having an element opening 2a is formed on one principal surface of a p-type semiconductor substrate 1, a gate insulating film 3 made of silicon oxide or the like is formed on the semiconductor surface exposed in the element opening 2a. After a polysilicon layer is deposited on the insulating film 3, the polysilicon layer is etched by using a resist layer 5 as a mask to leave a gate electrode layer 4 of polysilicon. In this case, the gate insulating film 3 just under the gate electrode layer 4 is left and the other gate insulating film is etched and removed.

Next, by using as a mask the resist layer 5, a lamination of the gate electrode layer 4 and gate insulating film 3 and the field insulating film, phosphorus ions are implanted into p-type substrate regions on both sides of the electrode layer 4 to form an $n^+$-type source region 6 and an $n^+$-type drain region 7.

In a process shown in FIG. 31, in the state that the gate electrode layer 4 is covered with the resist layer 5, the electrode layer 4 is isotropically etched to thin it through side etching. A width (gate width) of the electrode layer 4 is thinned, for example, to 0.8 μm to 0.5 μm.

In a process shown in FIG. 32, after the resist layer 5 is removed, by using as a mask a lamination of the gate electrode layer 4 and gate insulating film 3 and the field insulating film 2, phosphorus ions are implanted to form an $n^-$-type source region 8 and an $n^-$-type drain region 9 in the p-type substrate regions on both sides of the electrode layer 4. The drain region 9 is generally called an LDD region.

SUMMARY OF THE INVENTION

According to the conventional method described above, if a photomask designed by the minimum design rule is used in a photolithography process of forming the resist layer 5, the gate electrode layer 4 having a width narrower than the resist layer 5 is formed by side etching in the process shown in FIG. 31. The LDD region 9 is formed under this fine pattern electrode layer 4 in the process shown in FIG. 32.

The above-described conventional method is, however, associated with a problem of a low manufacture yield. Namely, in the side etching process shown in FIG. 31, an isotropic etching process is executed in the state that the gate electrode layer 4 is covered with the resist layer 5 so that it is not easy to control a side etching amount and there is a variation in side etching amounts. A variation in gate widths is therefore large. In the ion implantation process shown in FIG. 30, since impurity ions are implanted into semiconductor exposed in the element opening 2a, there is a large variation in impurity ion arrival depths because of a so-called channeling phenomenon. There is therefore a large variation in depths of the $n^+$-type regions 6 and 7.

Furthermore, if an oblique ion implantation is used in the ion implantation process shown in FIG. 30, an inclination angle of ion implantation cannot be set large because implanted ions are shaded by the resist layer 5, resulting in a small dose of ion implantation near the gate electrode layer 4. There is therefore a large variation in impurity concentrations of the $n^+$-type regions 6 and 7.

An object of the present invention is to provide a novel method of manufacturing, with a good yield, insulated gate type field effect transistors having an LDD structure and a fine gate electrode.

According to one aspect of the present invention, there is provided a first method of manufacturing an insulated gate type field effect transistor comprising steps of: (a) preparing a semiconductor substrate having at least a region of a first conductivity type on a side of one principal surface; (b) forming a field insulating film on the one principal surface of the semiconductor substrate, the field insulating film having an element opening corresponding to the region; (c) forming a gate insulating film on a semiconductor surface in the element opening; (d) forming a gate electrode layer on the gate insulating film; (e) forming high impurity concentration source and drain regions of a second conductivity type opposite to the first conductivity type in the first conductivity type region on both sides of the gate electrode layer, by an impurity doping process using as an impurity mask a lamination of the gate electrode layer and the gate insulating film and the field insulating film; (f) etching an upper surface and side walls of the gate electrode layer by an isotropic etching process to make the gate electrode layer narrow and thin; and (g) forming low impurity concentration source and drain regions of the second conductivity type in the first conductivity type region on both sides of the gate electrode layer and adjacent to the high impurity concentration source region and drain region, by an impurity doping process using as an impurity mask a lamination of the narrow and thin gate electrode layer and the gate insulating film and the field insulating film.

According to the first method, since the upper surface and side walls of the gate electrode are etched by the isotropic etching process, the gate electrode layer can be made narrow and thin. It is therefore easy to control an etching amount and the width of the gate electrode layer can be set precisely.

In the first method, the impurity doping process in the step (e) may implant impurity ions via the gate insulating film into the first conductivity type region on both side of the gate electrode layer. In this case, impurity ions are implanted via the gate insulating film into the region not covered with the impurity mask. It is therefore possible to suppress a channeling phenomenon and reduce a variation in depths of the high impurity concentration source and drain regions.

In the first method, the high impurity concentration source and drain regions may be formed extending from regions on both sides of the gate electrode layer to regions under the gate electrode layer, and the low impurity concentration source and drain regions may be disposed under the gate electrode layer and adjacent to the high impurity concentration source and drain regions. In forming the high impurity concentration source and drain regions, the impurity doping process can be executed in the state that a resist layer is not disposed on the gate electrode layer. Therefore, by using an oblique ion implantation process as the impurity doping process, the high impurity concentration source and drain regions can be formed with a small variation in depths and impurity concentrations. Since the high impurity concentration source and drain regions are formed extending from regions on both sides of the electrode layer toward regions under the gate electrode layer, it is possible to prolong a hot carrier life time and delay the deterioration of transistor characteristics. In forming the low impurity concentration source and drain regions, the impurity doping process can be executed in the state that the gate electrode layer is made narrow and thin and the resist layer is not disposed on the gate electrode layer. Therefore, by using an oblique ion implantation process as the impurity doping process, the low impurity concentration source and drain regions can be formed with a small variation in depths and impurity concentrations. Since the low impurity concentration source and drain regions are disposed under the gate electrode layer and adjacent to the high impurity concentration source and drain regions, a drive ability of transistors can be improved.

According to another aspect of the present invention, there is provided a second method of manufacturing an insulated gate type field effect transistor comprising steps of: (a) preparing a semiconductor substrate having at least a region of a first conductivity type on a side of one principal surface; (b) forming a field insulating film on the one principal surface of the semiconductor substrate, the field insulating film having an element opening corresponding to the region; (c) forming a gate insulating film on a semiconductor surface in the element opening; (d) forming a gate electrode layer on the gate insulating film; (e) forming source and drain regions of a second conductivity type opposite to the first conductivity type in the first conductivity type region on both sides of the gate electrode layer, by an impurity doping process using as an impurity mask a lamination of the gate electrode layer and the gate insulating film and the field insulating film; (f) etching an upper surface and side walls of the gate electrode layer by an isotropic etching process to make the gate electrode layer narrow and thin; (g) after the gate electrode layer is made narrow and thin, forming first and second insulating side spacers covering side walls of the gate electrode layer on the gate insulating film, and removing the gate insulating film excepting the gate insulating film under the gate electrode layer and the first and second insulating side spacers to expose the source and drain regions; (h) forming a silicide forming metal layer covering the gate electrode layer, the first and second insulating side spacers, the gate insulating film, the source region and the drain region; and (i) silicidating the silicide forming metal layer with the gate electrode layer, the source region and the drain region, by heat treatment and thereafter removing an unreacted silicide forming metal layer to form a first silicide layer on the gate electrode layer, a second silicide layer on the source region and a third silicide layer on the drain region.

According to the second method, similar to the description made on the first method, a width of the gate electrode layer can be set precisely. Furthermore, the position of the second silicide layer above the source region can be set precisely by using the first insulating side spacer and the position of the third silicide layer above the drain region can be set precisely by using the second insulating side spacer.

In the second method, the source region and the drain region have a high impurity concentration and extend from regions on both sides of the gate electrode layer toward regions under the gate electrode layer, and after the gate electrode layer is made narrow and thin and before the first and second insulating side spacers are formed, low impurity concentration source and drain regions of the second conductivity type may be formed in the first conductivity type region on both sides of the gate electrode layer under the gate electrode layer and adjacent to the source region and the drain region, by an impurity doping process using as an impurity mask a lamination of the gate electrode layer and the gate insulating film and the field insulating film. In this case, similar to the description made on the first method, the high impurity concentration source and drain regions and the low impurity concentration source and drain regions can be formed at a small variation in depths and impurity concentrations. It is also possible to delay the deterioration of transistor characteristics and improve a transistor drive ability.

According to still another aspect of the present invention, there is provided a third method of manufacturing an insulated gate type field effect transistor (hereinafter called a MOS type transistor) comprising steps of: (a) preparing a semiconductor substrate having a first region of a first conductivity type on a side of one principal surface and a second region of a second conductivity type opposite to the first conductivity type on the side of the one principal surface; (b) forming a field insulating film on the one principal surface of the semiconductor substrate, the field insulating film having first and second element openings corresponding to the first and second regions; (c) forming first and second gate insulating films on a semiconductor surface in the first and second element openings; (d) forming first and second gate electrode layers on the first and second gate insulating films; (e) forming a first resist layer on the field insulating film, the first resist layer exposing the first element opening and covering the second element opening; (f) forming high impurity concentration first source and drain regions of the second conductivity type in the first conductivity type region on both sides of the first gate electrode layer, by an impurity doping process using as an impurity mask the first resist layer, a lamination of the first gate electrode layer and the first gate insulating film and the field insulating film; (g) etching an upper surface and side walls of the first gate electrode layer by an isotropic etching process using the first resist layer as an etching mask to make the first gate electrode layer narrow and thin; (h) forming low impurity concentration second source and drain regions of the second conductivity type in the first conductivity type region on both sides of the first gate electrode layer and adjacent to the first source region and the first drain region, by an impurity doping process using as an impurity mask the first resist layer, a lamination of the narrow and thin first gate electrode layer and the first gate insulating film and the field insulating film; (i) after the first resist layer is removed, forming a second resist layer on the field insulating film, the second resist layer exposing the second element opening and covering the first element opening; (j) forming high impurity concentration third source and drain regions of the first conductivity type in the second conductivity type region on both sides of the second gate electrode layer, by an impurity doping process using as an impurity mask the second resist layer, a lamination of the second gate electrode layer and the second gate insulating film and the field insulating film; (k) etching an upper surface and side walls of the second gate electrode layer by an isotropic etching process using the second resist layer as an etching mask to make the second gate electrode layer narrow and thin; (l) forming low impurity concentration fourth source and drain regions of the first conductivity type in the second conductivity type region on both sides of the second gate electrode layer and adjacent to the third source region and the third drain region, by an impurity doping process using as an impurity mask the second resist layer, a lamination of the narrow and thin second gate electrode layer and the second gate insulating film and the field insulating film; and (m) removing the second resist layer.

According to the third method, complementary MOS type transistors (hereinafter called CMOS type transistors) having opposite channel conductivity types can be manufactured with a small number of photolithography processes. Namely, after the first and second gate electrode layers are formed, only first and second resist layers are formed so that only two photolithography processes are required. In contrast, according to a conventional well-known method of manufacturing CMOS type transistors having the LDD structure, two resist layers (one before forming side spacers and one after forming side spacers) are required for each of p- and n-channel MOS type transistors, four processes in total. According to the third method of the present invention, the number of photolithography processes can be halved as compared to the conventional method.

In the third method, in the steps (g) and (k), different etching amounts may be used in the isotropic etching processes to make the first and second gate electrode layers have different widths and thicknesses. In this case, the widths of the first and second gate electrode layers are different and the first and second gate electrode layers are used as the gate electrode layers of n- and p-channel MOS type transistors. For an n-channel MOS type transistor, the gate electrode layer is made narrow to broaden the width of the low impurity concentration drain region (LDD region) and prolong the transistor life time (utilizing more effectively a drain electric field relaxing function). For a p-channel MOS type transistor, the gate electrode layer is made wider to narrow the LDD region (reducing the resistance components in the LDD region) and enhance a drive ability.

In the third method, it may be structured in such a way that the first source and drain regions are formed extending from regions on both sides of the first gate electrode layer to regions under the first gate electrode layer, the second source and drain regions are disposed under the first gate electrode layer and adjacent to the first source and drain regions, the third source and drain regions are formed extending from regions on both sides of the second gate electrode layer to regions under the second gate electrode layer, and the fourth source and drain regions are disposed under the second gate electrode layer and adjacent to the third source and drain regions. In this case, similar to the description made on the first method, the first and third source regions, first and third drain regions, second and fourth source regions, and second and fourth drain regions can be formed at a small variation in depths and impurity concentrations. It is also possible to delay the deterioration of transistor characteristics and improve a transistor drive ability.

The third method may further comprise steps of: (n) after the second resist layer is removed, forming first and second insulating side spacers covering side walls of the first gate electrode layer on the first gate insulating film, forming third and fourth insulating side spacers covering side walls of the second gate electrode layer on the second gate insulating film, removing the first gate insulating film excepting the first gate insulating film under the first gate electrode layer and the first and second insulating side spacers, and removing the second gate insulating film excepting the second gate insulating film under the second gate electrode layer and the third and fourth insulating side spacers, to thereby expose the first and third source regions and the first and third drain regions; (O) forming a silicide forming metal layer covering the first and second gate electrode layers, the first to fourth insulating side spacers, the first and second gate insulating films, the first and third source regions and the first and third drain regions; and (p) silicidating the silicide forming metal layer with the first and second gate electrode layers, the first and third source regions and the first and third drain regions, by heat treatment and thereafter removing an unreacted silicide forming metal layer to form first and second silicide layers on the first and second gate electrode layers, third and fourth silicide layers on the first and third source regions, and fifth and sixth silicide layers on the first and third drain regions.

In this case, similar to the description made on the second method, the position of each silicide layer can be set precisely by using each insulating side spacer.

According to the present invention, it is possible to set a width of the gate electrode layer precisely, to reduce a variation in depths and impurity concentrations of the source and drain regions, and to set the position of each silicide layer precisely due to each insulating side spacer. It is therefore possible to improve a manufacture yield of MOS type transistors. Since CMOS type transistors can be manufactured at a small number of photolithography processes, cost reduction is possible.

DESCRIPTION OF THE PREFERRED EMBODIMENTS

Figure 1:
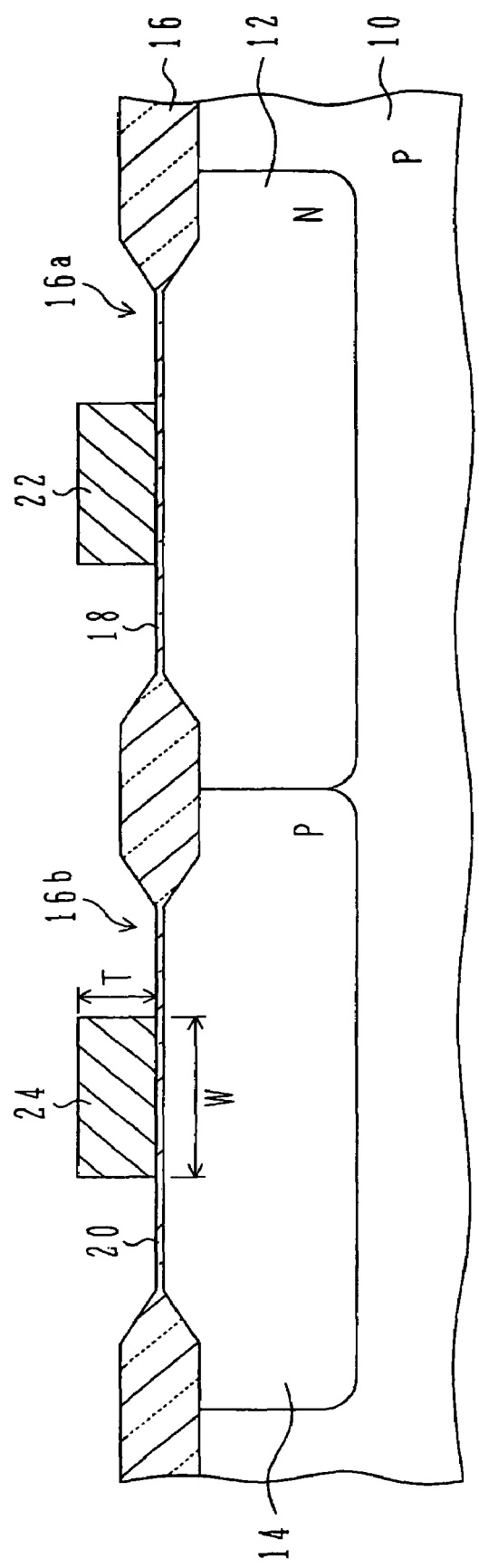
FIG. 1 is a cross sectional view illustrating a gate electrode patterning process of a CMOS type IC manufacture method according to an embodiment of the present invention.

FIGS. 1 to 9 illustrate a manufacture method for a CMOS type IC (an integrated circuit including CMOS type transistors) according to an embodiment of the present invention. Processes (1) to (9) corresponding to FIGS. 1 to 9 will be described sequentially.

(1) In a principal surface layer of a semiconductor substrate 10 made of, e.g., p-type silicon, an n-type well 12 and a p-type well 14 are formed by a well-known selective impurity ion implantation process. A field insulating film 16 made of silicon oxide and having element openings 16a and 16b corresponding to the wells 12 and 14 is formed by a well-known selective oxidation method. The field insulating film 16 may be formed by forming a trench in a substrate surface layer by a selective etching process and thereafter burying an insulating film in the recess by a chemical vapor deposition (CVD) method or the like.

Next, gate insulating films 18 and 20 of silicon oxide are formed on the semiconductor surface exposed in the element openings 16a and 16b of the field insulating film 16, by a well-known thermal oxidation method. If necessary, before or after the formation of the gate insulating films 18 and 20, impurities may be doped in the semiconductor surface layers exposed in the element openings 16a and 16b in order to obtain a desired threshold voltage or a desired punch through voltage. In forming the gate insulating films 18 and 20, it is preferable to form a thin silicon oxide film (sacrificial film) on the semiconductor surfaces exposed in the element openings 16a and 16b by a thermal oxidation method and remove this film with dilute hydrofluoric acid to thereby clean the semiconductor surfaces exposed in the element openings 16a and 16b. For example, after a thin silicon oxide film (sacrificial film) formed by thermal treatment at 950° C. in a dry $O_2$ atmosphere is removed, the gate insulating films 18 and 20 of silicon oxide are formed to a thickness of 25 nm by heat treatment at 950° C. in a dry $O_2$ atmosphere.

Each of the gate insulating films 18 and 20 is not limited to a single layer film of silicon oxide or the like, but is may be made of a lamination layer. The lamination layer may be: a lamination layer of a silicon oxide film and a silicon nitride film (or silicon oxynitride film); a lamination layer of a silicon nitride film (or silicon oxynitride film) sandwiched between upper and lower silicon oxide films (or a sandwiched lamination layer including silicon oxide films and silicon nitride films); a lamination layer of a tantalum oxide film (or ferroelectric film) and one of a silicon oxide film, a silicon nitride film and a silicon oxynitride film; or the like.

In forming a silicon oxide film constituting the lamination film, a plasma enhanced type CVD system or an electron cyclotron resonance (ECR) type CVD system may be used by using as a source gas a mixture gas of tetraethylorthosilicate (TEOS) and ozone ($O_3$). In forming a silicon nitride film or a silicon oxynitride film constituting the lamination film, a plasma enhanced type CVD system or an ECR type CVD system may be used by using as a source gas a mixture gas of TEOS, $O_2$ (or $O_3$) and nitrogen oxide ($NO_x$).

Next, a polysilicon layer is deposited on the upper surface of the substrate by CVD. For example, the polysilicon deposition conditions may be:

gas: mixture gas of $SiH_4$ (20%) and $N_2$ (80%)
gas flow rate: 200 sccm
pressure: 30 Pa
substrate temperature: 600° C.:

As the substrate temperature is set much lower than 600° C., an amorphous silicon layer is deposited instead of the polysilicon layer. In this case, as a heating process is executed to raise the substrate temperature to 600° C. or higher, the amorphous silicon layer is crystallized to form a polysilicon layer.

A thickness of the polysilicon layer is selected as desired, for example, in a range from 50 to 1000 nm (preferably from 100 to 300 nm). After the polysilicon layer is formed, conductivity type determining impurities such as phosphorus are diffused into the polysilicon layer by an impurity diffusion process to set an impurity concentration to about $10^{20}$ cm$^{-3}$. A resistance of the polysilicon layer is therefore lowered to the extent that it can be used as an electrode or wiring.

Next, the polysilicon layer is patterned by a dry etching process using a resist layer as a mask to form gate electrode layers 22 and 24 made of the left polysilicon layer on the gate insulating films 18 and 20. This dry etching is executed by using a microwave plasma etching system (microwave frequency of 2.54 GHz). For example, the etching conditions may be:

gas: Cl$_2$/O$_2$ (75/6 sccm)
pressure: several mTorr
RF power: 30 W

CF$_4$ gas or SF$_6$ gas may also be used. It is desired to use as the etching system a high density plasma etching system such as a microwave plasma etching system and an ECR plasma etching system.

For example, a thickness T and width W of the gate electrode layer 24 were set to 500 nm and 1.4 µm, respectively, and a thickness and width of the gate electrode layer 22 were set equal to the thickness T and width W of the gate electrode layer 24, respectively, After the gate electrode layers 22 and 24 are formed, the resist layer used as the etching mask is removed by a well-known ashing process or the like.

(2) A resist layer 26 having an opening 26b corresponding to the element opening 16b is formed on the upper surface of the substrate by a photolithography process. Exposed in the opening 26b of the resist layer 26 are the gate electrode layer 24, the gate insulating films 20 on both sides of the electrode layer 24 and portions of the field insulating film 16 near the element opening 16b. The resist layer 26 covers the element opening 16a above the n-type well 12.

Next, by using as a mask the resist layer 26, a lamination of the gate electrode layer 24 and gate insulating film 20 and the field insulating film 16, arsenic (As) ions are implanted to form an n$^+$-type source region 28 and an n$^+$-type drain region 30 in p-type substrate regions in the p-type well 14 on both sides of the gate electrode layer 24. For example, the ion implantation conditions may be 80 keV and 5×10$^{15}$ cm$^{-2}$. In this ion implantation process, phosphorus (P) may be used instead of arsenic.

(3) An isotropic etching process is executed by using the resist layer 26 as a mask to etch the upper surface and side walls of the gate electrode layer 24 and make the gate electrode layer 24 narrow and thin. As the isotropic etching process, a wet etching process was executed. A mixture liquid of H$_2$O/HNO$_3$/(CH$_3$COOH/I$_2$)/CH$_3$COOH/NH$_4$F was used as etchant, and a time during which the substrate 10 was dipped in etchant was set to 6 seconds. As the isotropic etching process, a dry etching process may be used which will be later described with reference to FIG. 12.

Figure 10:
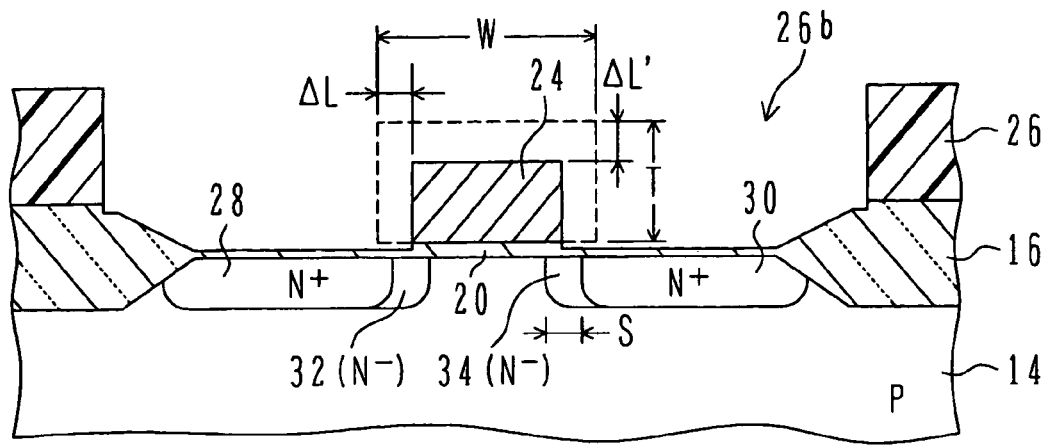
FIG. 10 is an enlarged cross sectional view showing an n-channel MOS transistor in the processes shown in FIGS. 3 and 4.

FIG. 10 illustrates this etching state. The isotropic etching reduced a width W of the gate electrode layer 24 by ΔL=0.2 µm on each side and a thickness T by ΔL'=0.2 µm. As a result, a width and thickness of the gate electrode layer 24 after etching were 1.0 µm and 300 nm, respectively. The width of the gate electrode layer 24 can be made narrower than the gate width W determined by the minimum design rule in the process of FIG. 1, and the width can be controlled to deep submicron.

The gate insulating film 20 and field insulating film 16 function as etching stopper films of this etching process and are slightly thinned in the portions contacting the etchant in the opening 26b of the resist layer 26. Therefore, polysilicon residues or the like formed in the gate electrode patterning process of FIG. 1 are removed. The gate insulating film 20 just under the left electrode layer 24 will not be thinned.

After the isotropic etching process, the resist layer 26 may be removed if desired to execute heat treatment. This heat treatment aims to diffuse and activate impurities diffused in the source region 28 and drain region 30 and recover defects caused by ion implantation, and can be executed in an inert gas atmosphere. This heat treatment may be executed in an oxidizing atmosphere to form a thin silicon oxide film on the surface of the gate electrode layer 24.

(4) By using as a mask the resist layer 26, a lamination of the gate electrode layer 24 and gate insulating film 20 and the field insulating film 16, arsenic (As) ions are implanted to form an n$^-$-type source region 32 and an n$^-$-type drain region (LDD region) 34 in p-type substrate regions in the p-type well 14 on both sides of the gate electrode layer 24 and adjacent to the n$^+$-type source region 28 and n$^+$-type drain region 30. For example, the ion implantation conditions may be 80 keV, 2×10$^{13}$ cm$^{-2}$, an inclination angle of 7 degrees and a rotation implantation of 6 rpm. In the ion implantation process, phosphorus ions may be implanted instead of arsenic ions. In order to obtain a desired threshold voltage, proper impurities may be doped into the gate electrode layer 24 by ion implantation or the like to change a work function of the electrode layer 24.

After the n$^-$-type regions 32 and 34 are formed, the resist layer 26 is removed by a well-known method. Heat treatment is executed at 800 to 1000° C. (preferably 950° C.) for 1 to 20 sec (preferably 10 sec) to activate implanted impurities in the n$^+$-type regions 28 and 30 and n$^-$-type regions 32 and 34.

(5) A resist layer 36 having an opening 36a corresponding to the element opening 16a is formed on the upper surface of the substrate by a photolithography process. Exposed in the opening 36a of the resist layer 36 are the gate electrode layer 22, the gate insulating films 18 on both sides of the electrode layer 22 and portions of the field insulating film 16 near the element opening 16a. The resist layer 36 covers the element opening 16b above the p-type well.

Next, by using as a mask the resist layer 36, a lamination of the gate electrode layer 22 and gate insulating film 18 and the field insulating film 16, boron (B) ions are implanted to form a p$^+$-type source region 38 and a p$^+$-type drain region 40 in n-type substrate regions in the n-type well 12 on both sides of the gate electrode layer 22.

(6) An isotropic etching process is executed by using the resist layer 36 as a mask to etch the upper surface and side walls of the gate electrode layer 22 and make the gate electrode layer 22 narrow and thin. As the isotropic etching process, a wet etching process or a dry etching process may be executed as described earlier with reference to FIGS. 3 and 10. For example, a width and thickness of the gate electrode layer 22 after the etching are 1.0µ and 300 nm.

After the isotropic etching process, the resist layer 36 may be removed if desired to execute heat treatment. This heat treatment aims to diffuse and activate impurities diffused in the source region 38 and drain region 40 and recover defects caused by ion implantation, and can be executed in an inert gas atmosphere. This heat treatment may be executed in an oxidizing atmosphere to form a thin silicon oxide film on the surface of the gate electrode layer 22.

(7) By using as a mask the resist layer 36, a lamination of the gate electrode layer 22 and gate insulating film 18 and the field insulating film 16, boron (B) ions are implanted to form a p$^-$-type source region 42 and a p$^-$-type drain region (LDD region) 44 in n-type substrate regions in the n-type well 12 on both sides of the gate electrode layer 22 and adjacent to the p+-type source region 38 and p+-type drain region 40. In order to obtain a desired threshold voltage, proper impurities may be doped into the gate electrode layer 22 by ion implantation or the like to change a work function of the gate electrode layer 22.

(8) After the p−-type regions 42 and 44 are formed, the resist layer 36 is removed by a well-known method. Heat treatment is executed to activate implanted impurities in the p+-type regions 38 and 40 and p−-type regions 42 and 44. Implanted impurities in the n+-type regions 28 and 30 and n−-type regions 32 and 34 may be activated by this heat treatment. In this case, the heat treatment for activating implanted impurities in the process of FIG. 4 can be omitted. With this heat treatment, the impurity diffusion in the n+-type regions 28 and 30, n−-type regions 32 and 34, p+-type regions 38 and 40, p−-type regions 42 and 44 may be controlled if necessary.

(9) An interlayer insulating film 46 of silicon oxide or the like is formed on the upper surface of the substrate by CVD or the like. Contact holes are formed through the insulating film 46 at positions corresponding to the source regions 28 and 38, drain regions 30 and 40 and gate electrode layers 22 and 24 by photolithography and dry etching processes. A conductive layer of Al alloy or the like is deposited on the insulating film 46 by sputtering or the like, burying the contact holes. Thereafter, the conductive layer is patterned by photolithography and dry etching processes to form electrode layers 48, 50, 54 and 56 and wiring layers 52 and 58. The source electrode layers 48 and 54 are connected to the source regions 38 and 28, respectively, via corresponding contact holes. The drain electrode layers 50 and 56 are connected to the drain regions 40 and 30, respectively, via corresponding contact holes. The gate wiring layers 52 and 58 are connected to the gate electrode layers 22 and 24, respectively, via corresponding contact holes.

Figure 3:
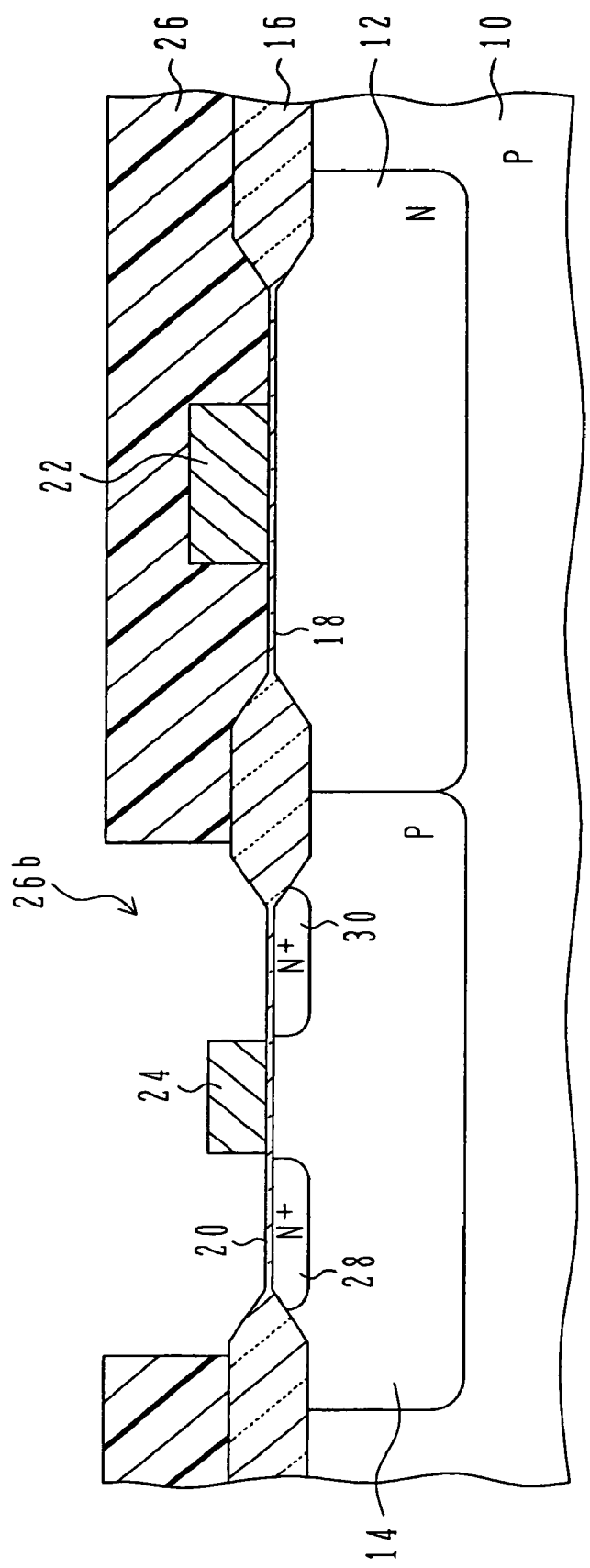
FIG. 3 is a cross sectional view illustrating a gate electrode etching process, following the process of FIG. 2.
Figure 4:
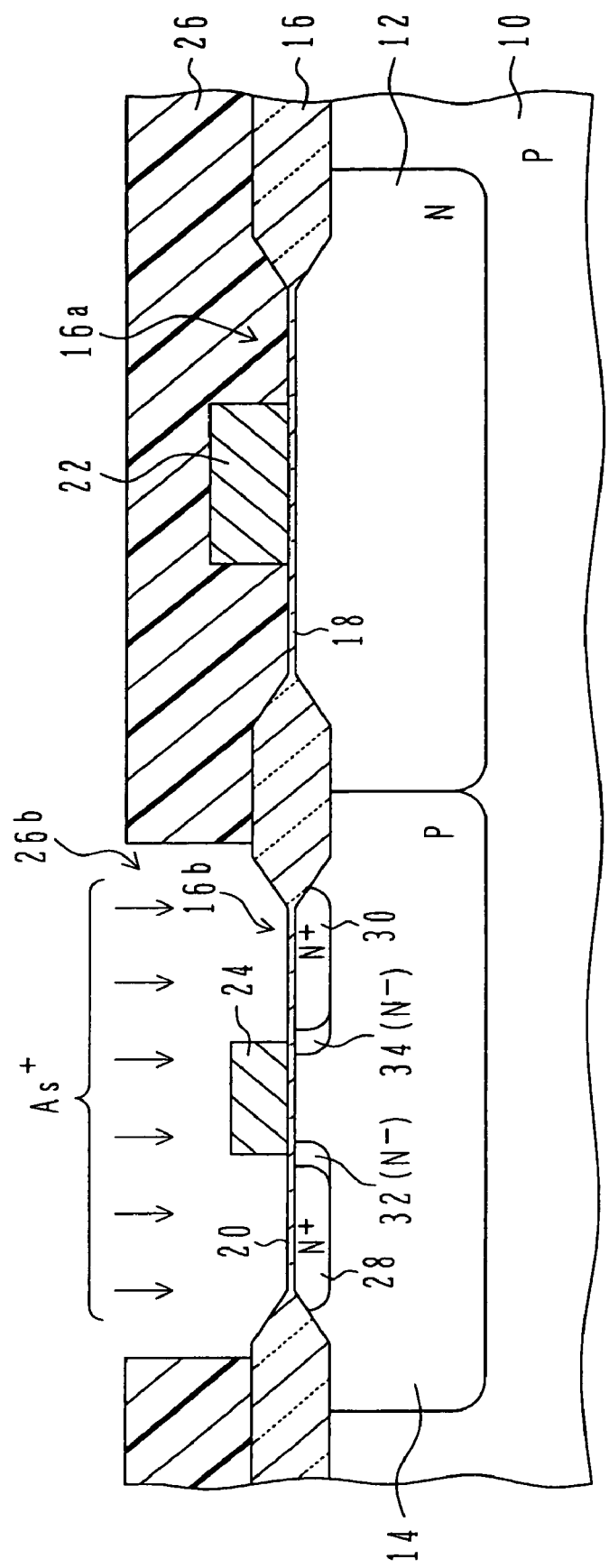
FIG. 4 is a cross sectional view illustrating a process of forming $n^-$-type source and drain regions, following the process of FIG. 3.
Figure 6:
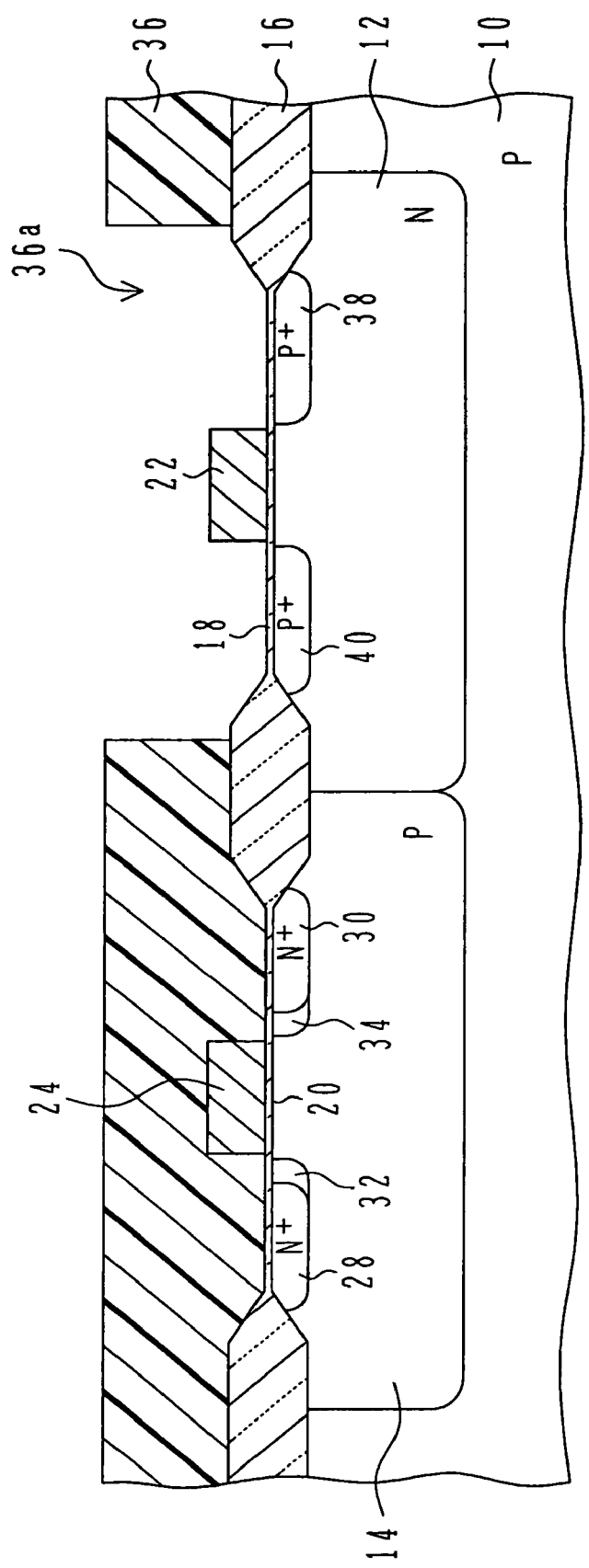
FIG. 6 is a cross sectional view illustrating a gate electrode etching process, following the process of FIG. 5.
Figure 7:
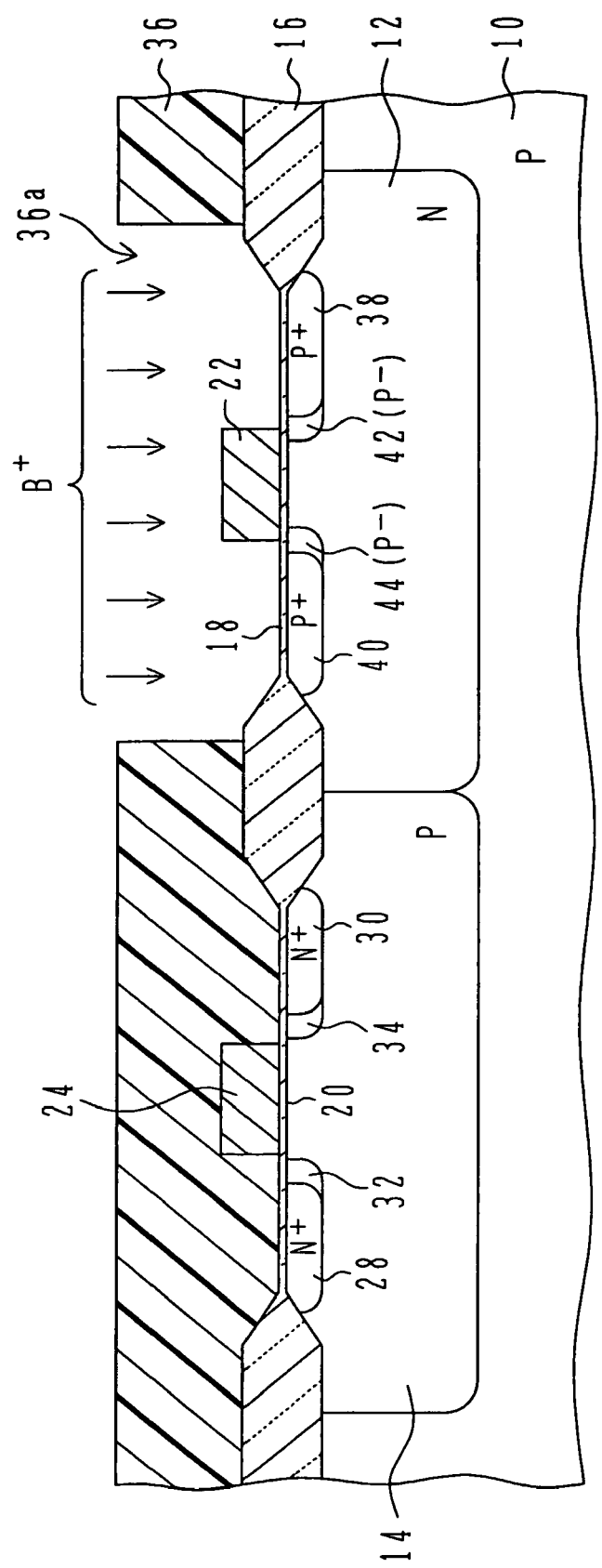
FIG. 7 is a cross sectional view illustrating a process of forming $p^-$-type source and drain regions, following the process of FIG. 6.
Figure 8:
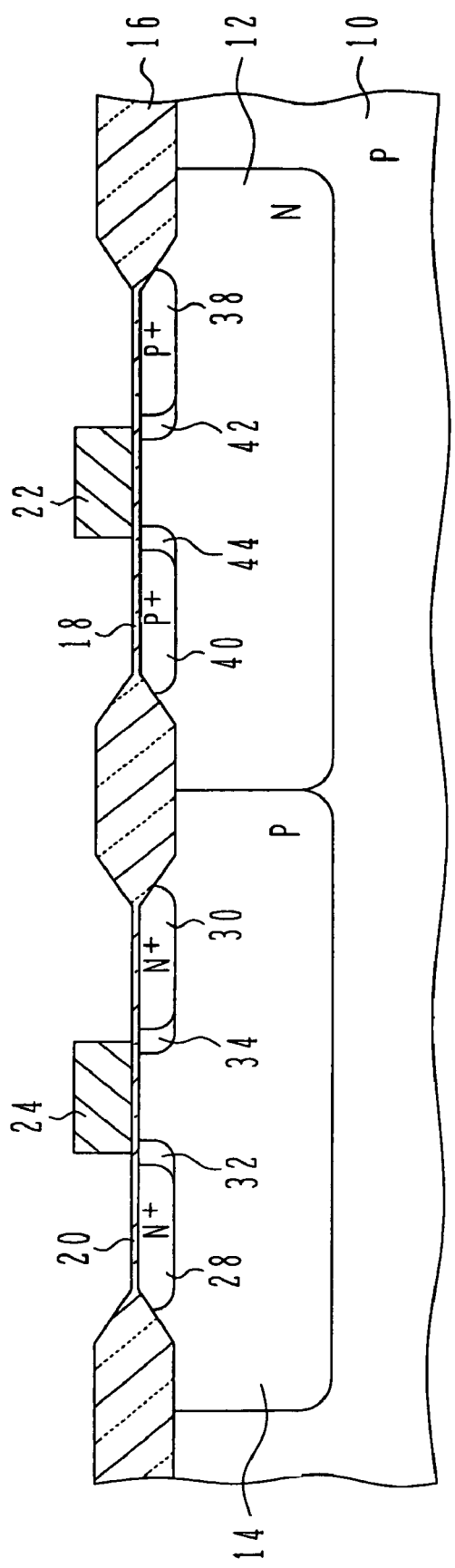
FIG. 8 is a cross sectional view illustrating a resist removing process, following the process of FIG. 7.

According to the above-described CMOS type IC manufacture method, if a photomask designed on the basis of the minimum design rule is used in the gate electrode patterning process of FIG. 1, both the gate electrode layers 22 and 24 have the minimum gate width. In the processes of FIGS. 3 and 6, since the gate electrodes 22 and 24 are subjected to the isotropic etching process, both the gate electrode layers 22 and 24 have a gate width narrower than the minimum gate width. In the processes of FIGS. 4 and 7, the LDD regions 34 and 44 are formed by using as a mask the gate electrode layers 22 and 24 having a narrower gate width. It is therefore possible to manufacture n- and p-channel MOS type transistors of the LDD structure having a fine gate pattern.

Figure 2:
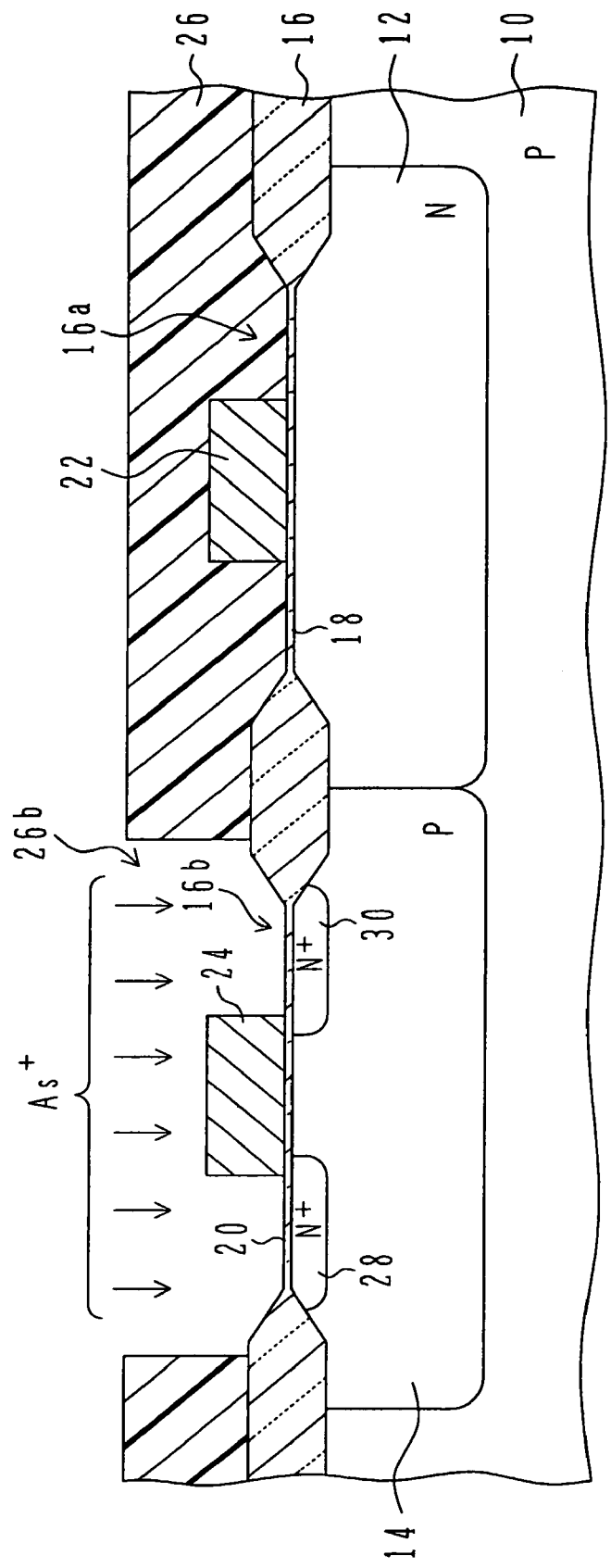
FIG. 2 is a cross sectional view illustrating a process of forming $n^+$-type source and drain regions, following the process of FIG. 1.
Figure 5:
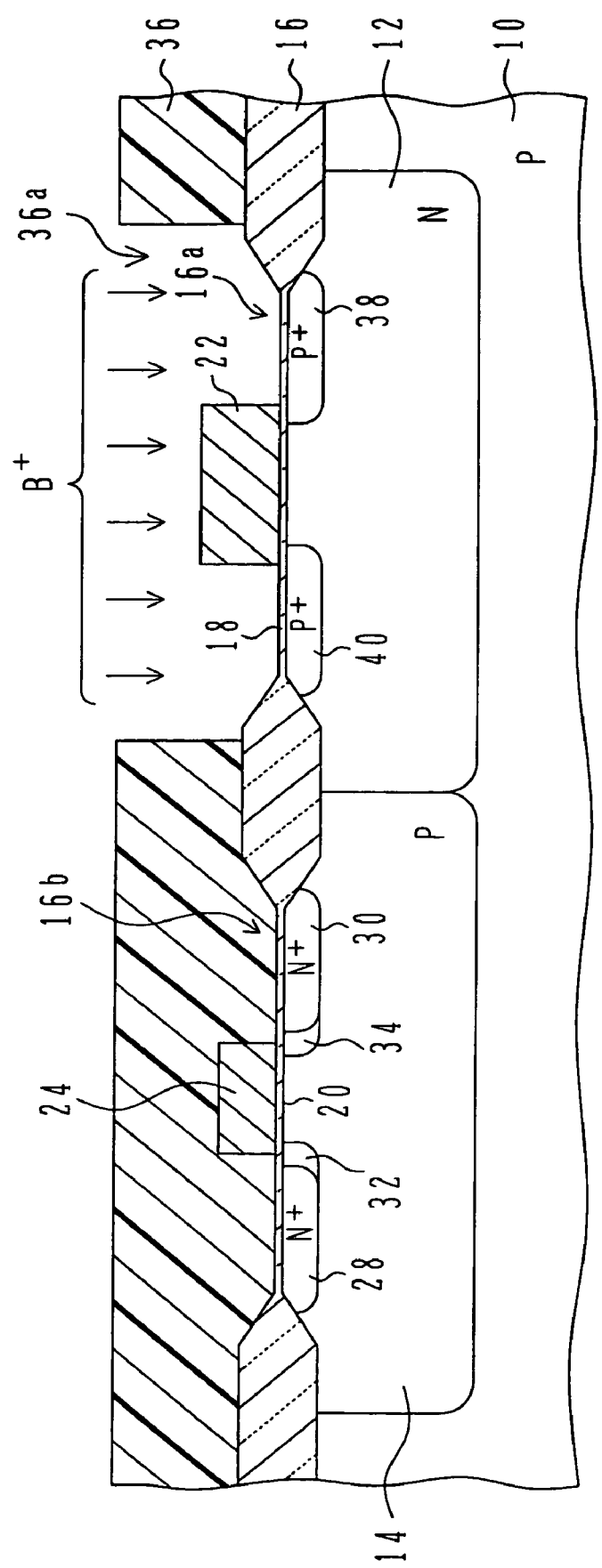
FIG. 5 is a cross sectional view illustrating a process of forming $p^+$-type source and drain regions, following the process of FIG. 4.

In the processes of FIGS. 3 and 6, the upper surface and side walls of the gate electrode layers are subjected to the isotropic etching so that an etching amount can be controlled easily and the widths of the gate electrode layers can be determined at a good precision. In the processes of FIGS. 2 and 5, since the impurity ions are implanted via the gate insulating films, the channeling phenomenon is suppressed and a variation in depths of the high impurity concentration source and drain regions can be reduced. A manufacture yield of MOS type transistors can therefore be improved.

After the gate electrode patterning process of FIG. 1, the resist layer 26 is used as a mask in the processes of FIGS. 2 to 4 and the resist layer 36 is used as a mask in the processes of FIGS. 5 to 7. Only two mask processes are used so that manufacture cost can be reduced more than a conventional method which uses four mask processes.

According to the above-described CMOS type transistor manufacture method, since the widths of the gate electrode layers 24 and 22 are made generally equal in the processes of FIGS. 3 and 6, the LDD widths of the LDD regions 34 and 44 formed in the processes of FIGS. 4 and 7 are almost equal. The LDD width is a distance S of the LDD region protruding from the high impurity concentration drain region to the region just under the gate electrode layer as shown in FIG. 10. The LDD width is desired in some cases to be different between n- and p-channel MOS type transistors.

For example, it is desired that for an n-channel MOS type transistor, the drain electric field relaxing function by the LDD structure is utilized effectively to prolong a transistor life time, and for a p-channel MOS type transistor, the resistance components by the LDD structure are reduced to enhance a drive ability. In order to meet these requirements, in the isotropic etching process of FIG. 3, the etching amount is set large to reduce the width and thickness of the gate electrode layer 24, and in the isotropic etching process of FIG. 6, the etching amount is set small to increase the width and thickness of the gate electrode layer 22. As a result, in the ion implantation process of FIG. 4, the LDD region 34 having a wide LDD width can obtained, and in the ion implantation process of FIG. 7, the LDD region 44 having a narrow LDD width can obtained. If desired, the etching process of FIG. 6 and the ion implantation process of FIG. 7 may be omitted in order not to form the low impurity concentration source and drain regions of the p-channel MOS type transistor. If the LDD width is made narrow or the LDD structure is not adopted in the p-channel MOS type transistor, a process time can be shortened.

Different LDD widths are not limited only to CMOS type transistors, but different LDD widths may be applied to a plurality of n-channel (or p-channel) MOS type transistors. To this end, an opening is formed through a resist mask for each transistor and an isotropic etching is executed at an etching amount corresponding to a desired LDD width.

Figure 11:
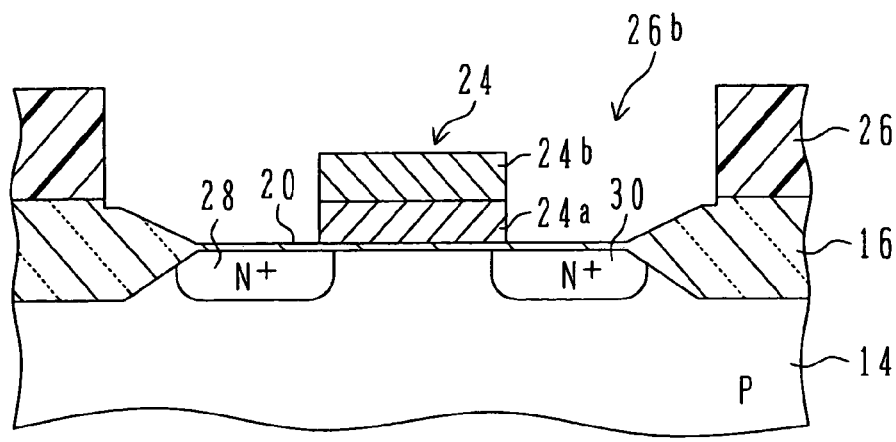
FIG. 11 is a cross sectional view illustrating a gate electrode forming process and an $n^+$-type source/drain region forming process in a polycide gate process according to a modification of the embodiment shown in FIGS. 1 to 9.
Figure 12:
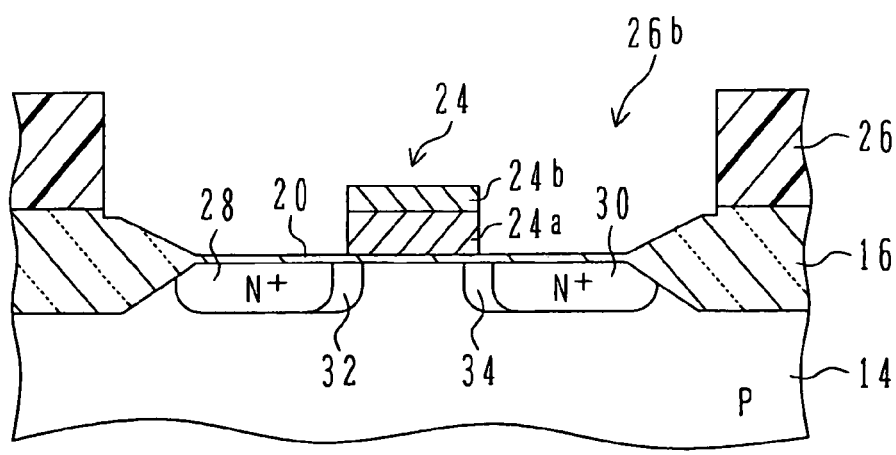
FIG. 12 is a cross sectional view illustrating a gate electrode etching process and an $n^-$-type source/drain region forming process, following the process of FIG. 11.

FIGS. 11 and 12 illustrate a polycide gate process according to a modification of the embodiment shown in FIGS. 1 to 9. Similar elements to those shown in FIGS. 1 to 9 are represented by identical reference symbols and the description thereof is omitted.

In a process of FIG. 11, similar to the above-described process of FIG. 1, a polysilicon layer is deposited on the upper surface of a substrate by CVD. If necessary, conductivity type determining impurities such as phosphorus may be doped into the polysilicon layer. Thereafter, a refractory metal silicide layer is deposited on the polysilicon layer by sputtering or CVD.

The refractory metal silicide layer may be a tungsten silicide ($WSi_x$) layer. If the tungsten silicide layer is to be formed by sputtering, a DC magnetron sputtering system is used by using $WSi_x$ as a sputtering target and Ar gas as sputtering gas. For example, the sputtering conditions may be:

Ar gas flow rate: 30 sccm
pressure: 3 mTorr
substrate temperature: 200° C.
supply power: 1150 W A thickness of the tungsten silicide layer can be set as desired in the range, for example, from 25 to 500 nm (preferably from 80 to 200 nm).

If the tungsten silicide layer is to be formed by CVD, a $WSi_2$ layer is deposited by utilizing the following chemical reaction, with tungsten hexafluoride ($WF_6$) and silane ($SiH_4$) being used as source gasses:

$$WF_6 + 2SiH_4 \rightarrow WSi_2 + 6HF + H_2$$

The refractory metal silicide layer is not limited to the tungsten silicide layer, but it may be a molybdenum silicide ($MoSI_x$) layer, a titanium silicide ($TiSi_x$) layer, a tantalum silicide ($TaSi_x$) layer or the like. The silicide layer may be formed on the polysilicon layer by forming a silicide forming metal layer on the polysilicon layer by sputtering or the like and thereafter silicidating the silicide forming metal with the polysilicon layer through heat treatment.

After the refractory metal silicide layer is deposited on the polysilicon layer in the manner described above, heat treatment is performed, for example, at 950 to 1100° C. (preferably 1000° C.) for one second to reduce an electric resistance of a lamination (hereinafter called a polycide layer) of the polysilicon layer and refractory metal silicide layer. This heat treatment also provides the effect of preventing the refractory metal silicide layer and polysilicon layer from being peeled off by a later heat treatment applied to the polycide layer (for example, heat treatment for baking and making dense, to be executed after an interlayer insulating film is formed).

Next, a dry etching process using a resist layer as a mask is executed to pattern the polycide layer and form a gate electrode layer 24 of a left polycide layer on the gate insulating film 20 as shown in FIG. 11. The gate electrode layer 24 has the structure that a refractory metal silicide layer 24b is stacked on a polysilicon layer 24a.

Dry etching for the polycide layer can be performed by using an ECR plasma etching system. For example, the etching conditions may be:

etching gas: $CL_2/O_2$ (25/11 sccm)
pressure: 2 mTorr
RF power: 40 W (frequency 13.56 MHz)
micro wave power: 1400 W (frequency 2.45 GHz)
electrode temperature: 15 to 20° C.

The field insulating film 16 and gate insulating film 20 function as etching stopper films, and are slightly thinned.

Similar to the description made with reference to FIG. 2, a resist layer 26 having an opening 26b is formed on the upper surface of the substrate and an arsenic ion implantation process is executed to form an $n^+$-type source region 28 and an $n^+$-type drain region 30.

In a process of FIG. 12, an isotropic etching process is executed by using the resist layer 26 as a mask to etch the upper surface and side walls of the gate electrode layer 24 and make the gate electrode layer 24 narrow and thin. The isotropic etching process may use mixture gas of $SF_6$ and Ar (or He) or mixture gas of Cl and Ar (or He) as etching gas.

Similar to the description made with reference to FIG. 4, a phosphorus ion implantation process is executed to form an $n^-$-type source region 32 and an $n^-$-type drain region (LDD region) 34. The resist layer 26 is thereafter removed by a well-known method.

Thereafter, processes corresponding to FIGS. 5 to 9 are executed. The gate electrode layer 22 is formed by patterning the polycide layer in the manner similar to the gate electrode 24 shown in FIG. 11 at the same time when the gate electrode layer 24 is formed. In the isotropic etching process of FIG. 6, the isotropic dry etching described with reference to FIG. 12 is executed. The other processes are executed in the manner similar to the description made with reference to FIGS. 5 to 9 to form a p-channel MOS type transistor having a polycide gate electrode.

The above-described CMOS type IC manufacture method according to the modification can provide the operation and effects similar to those of the embodiment described with reference to FIGS. 1 to 9 and in addition can reduce the gate electrode resistance because the gate electrode layer is made of the polycide layer.

Instead of the polycide layer, the gate electrode layer may be made of a lamination of a metal layer formed on a polysilicon layer. Also in this case, the gate electrode resistance can be reduced. The material of the metal layer may be refractory metal such as Mo, Ti, Ta, W, Hf and Zr, transition metal such as Co, Cr, Ir, Nb, Ni and Pt, noble metal, alloy of a plurality of these metals optionally selected, or the like.

FIGS. 13 to 20 illustrate a manufacture method for a CMOS type IC according to another embodiment of the present invention. Like elements to those shown in FIGS. 1 to 9 are represented by identical reference symbols and the description thereof is omitted.

Figure 13:
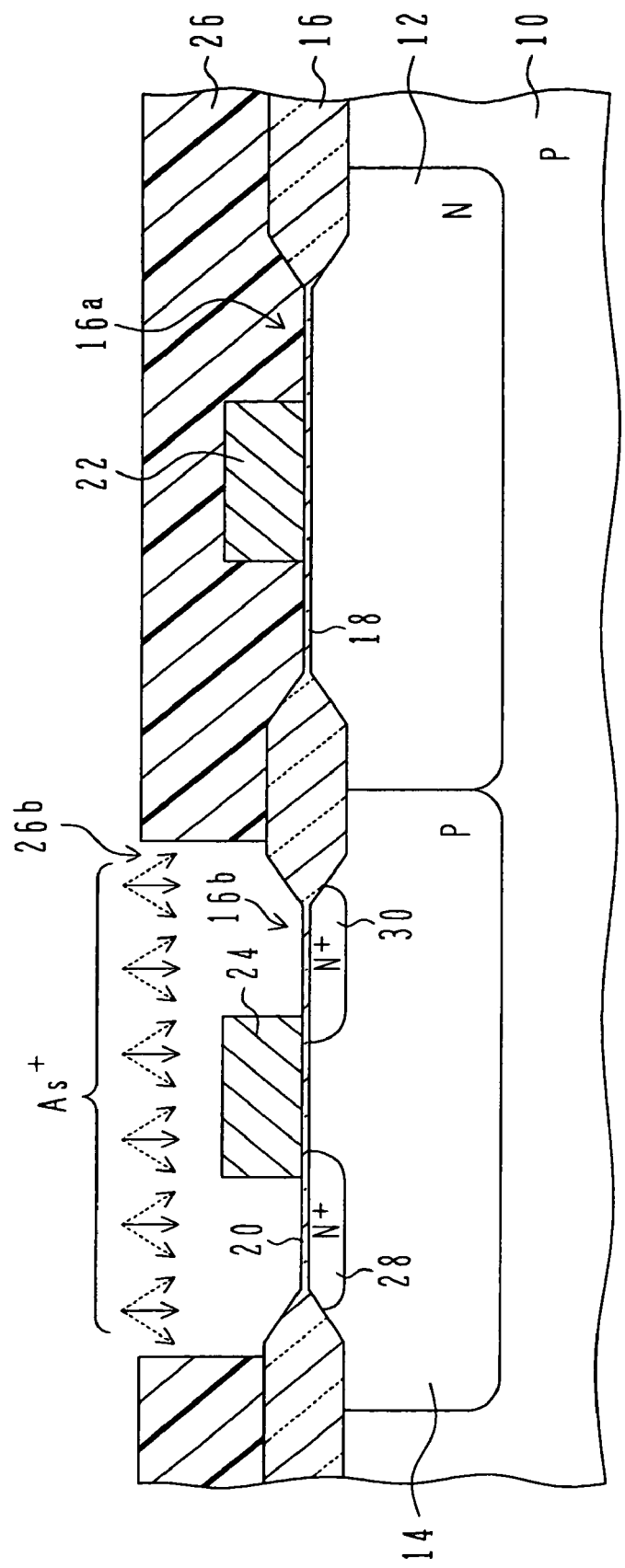
FIG. 13 is a cross sectional view illustrating a gate electrode etching process and an $n^+$-type source/drain region forming process in a CMOS type IC manufacture method according to another embodiment of the present invention.

A process of FIG. 13 is an ion implantation process following the gate electrode patterning process shown in FIG. 1. This ion implantation process forms an $n^+$-type source region 28 and an $n^+$-type drain region 30. Namely, similar to the description made with reference to FIG. 2, by using as a mask a resist layer 26, a lamination of a gate electrode layer 24 and a gate insulating film 20 and a field insulating film 16, arsenic (or phosphorus) ions are implanted. In this ion implantation process, arsenic ions and phosphorus ions may be implanted at two stages. As indicated by broken-line arrows, it is preferable to implant ions obliquely to distribute the ions also under the gate electrode layer 24. The oblique ion implantation conditions may be 80 keV, $6 \times 10^{15}$ cm$^{-2}$ and an inclination angle of 45 degrees when arsenic is used as impurities.

Figure 14:
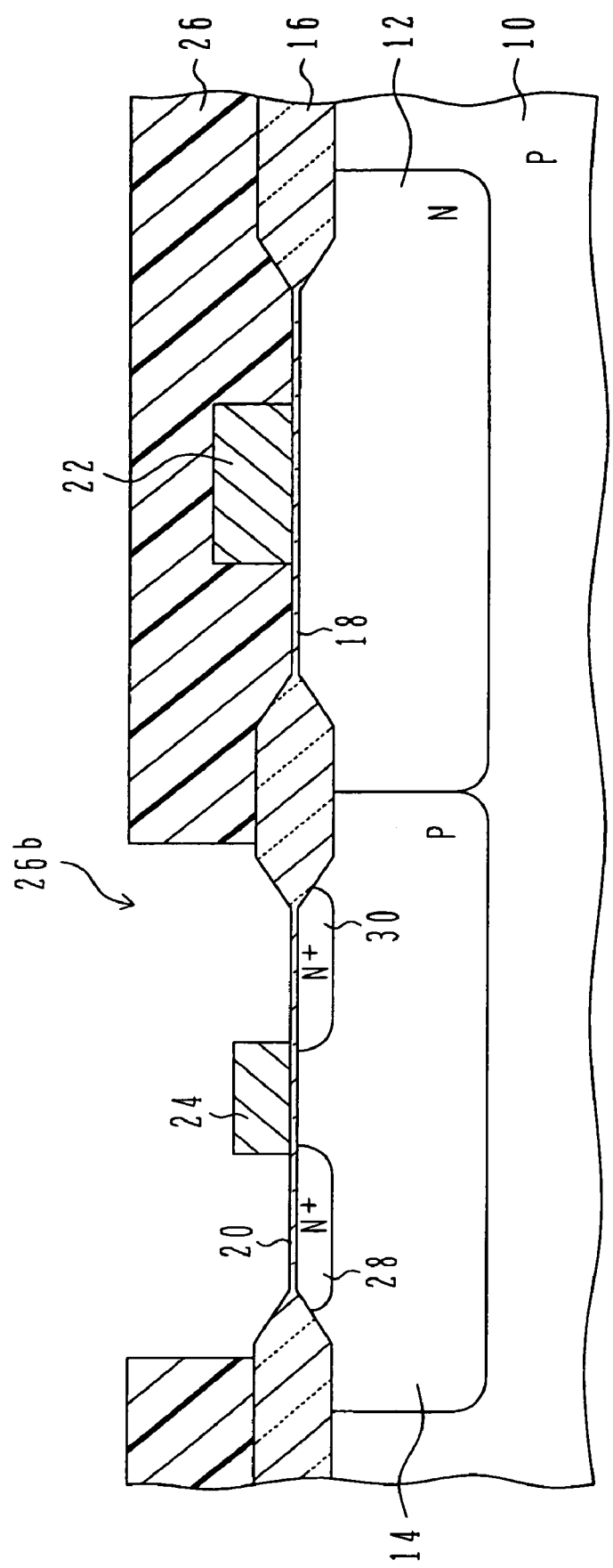
FIG. 14 is a cross sectional view illustrating a gate electrode etching process, following the process of FIG. 13.
Figure 21:
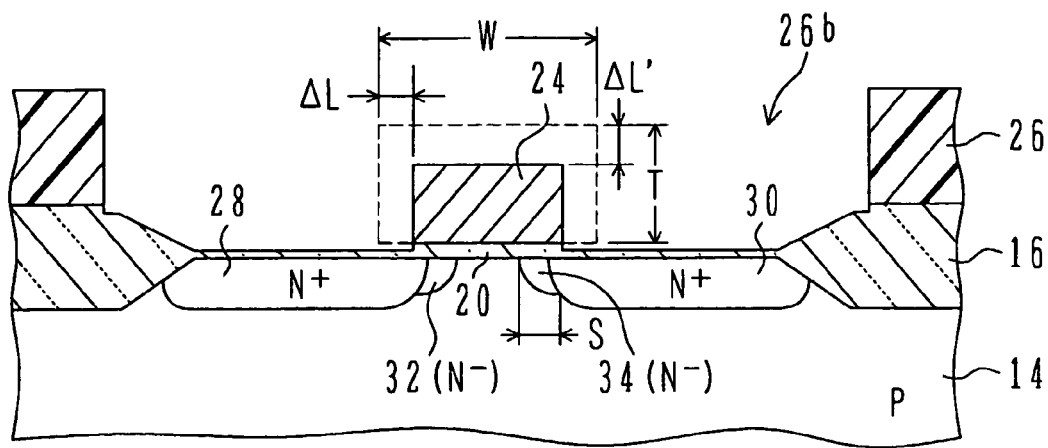
FIG. 21 is an enlarged cross sectional view showing an n-channel MOS transistor in the processes shown in FIGS. 14 and 15.

In a process of FIG. 14, similar to the description made with reference to FIG. 3, an isotropic wet (or dry) etching process is executed by using the resist layer 26 as a mask to make the gate electrode layer 24 narrow and thin. FIG. 21 illustrates this etching state of the gate electrode layer 24. The size W, $\Delta L$ and $\Delta L'$ are set to the same values described with reference to FIG. 10. In FIG. 21, like elements to those shown in FIG. 10 are represented by identical reference symbols.

The resist layer 26 may be removed if desired to execute heat treatment. This heat treatment aims to diffuse and activate impurities diffused in a source region 28 and a drain region 30 and recover defects caused by ion implantation, and can be executed in an inert gas atmosphere. This heat treatment may be executed in an oxidizing atmosphere to form a thin silicon oxide film on the surface of the gate electrode layer 24.

With this heat treatment, the $n^+$-type source region 28 and $n^+$-type drain region 30 are formed extending from the regions on both sides of the gate electrode layer 24 toward regions under the gate electrode layer 24 and toward regions under the field insulating film 16. FIG. 21 is an enlarged view showing the source region 28 and drain region 30. If the oblique ion implantation is executed, impurities are distributed easily under the gate electrode layer 24. Therefore, in the heat treatment, implanted impurities may only be activated without diffusion.

Figure 15:
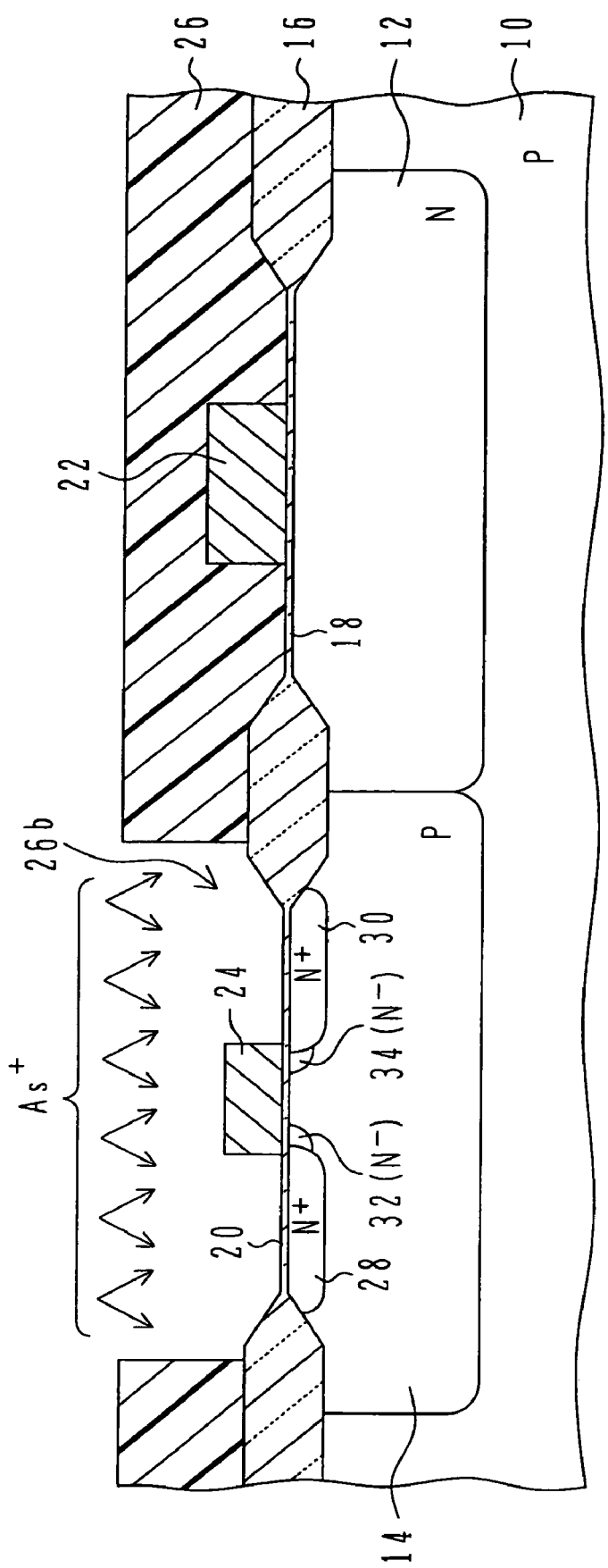
FIG. 15 is a cross sectional view illustrating a process of forming n$^-$-type source and drain regions, following the process of FIG. 14.

Next, in a process of FIG. 15, by using as a mask the resist layer 26, a lamination of the gate electrode layer 24 and gate insulating film 20 and the field insulating film 16, arsenic (As) ions are implanted to form an $n^-$-type source region 32 and an $n^-$-type drain region 34 in a p-type well 14 and under the gate electrode layer 24 and adjacent to the $n^+$-type source region 28 and $n^+$-type drain region 30.

In the ion implantation process, it is preferable to use the oblique ion implantation process which can distribute implanted impurities under the gate electrode. If arsenic is used as implanted impurities, the ion implantation conditions may be 120 keV, $2.3\times10^{13}$ cm$^{-2}$, an inclination angle of 45 degrees and a rotation implantation (1.8 rpm). If phosphorus is used as implanted impurities, the ion implantation conditions may be 40 keV, $2.31\times10^{13}$ cm$^{-2}$, an inclination angle of 40 degrees and a rotation implantation (1.8 rpm). In either case, instead of a continuous rotation implantation, a step rotation implantation at two or four stages may be used. In the rotation implantation at two stages, after the substrate (wafer) is set to a substrate holder by disposing an orientation flat (OF) at a reference position, ion implantation is performed at the OF rotation angles of 45 degrees and 225 degrees. In the rotation implantation at four stages, ion implantation is performed at the OF rotation angles of 45 degrees, 135 degrees, 225 degrees and 315 degrees.

After the n$^-$-type regions 32 and 34 are formed, the resist layer 26 is removed by a well-known method. Heat treatment is executed at 800 to 1000° C. (preferably 900 to 950° C.) for 1 to 20 sec (preferably 10 to 15 sec) to activate implanted impurities in the n$^+$-type regions 28 and 30 and n$^-$-type regions 32 and 34. FIG. 21 is an enlarged view showing the n$^-$-type regions 32 and 34. With this heat treatment, the impurity diffusion in the n$^+$-type regions 28 and 30 and n$^-$-type regions 32 and 34 may be controlled to realize the layout of the source/drain regions such as shown in FIG. 21.

Figure 16:
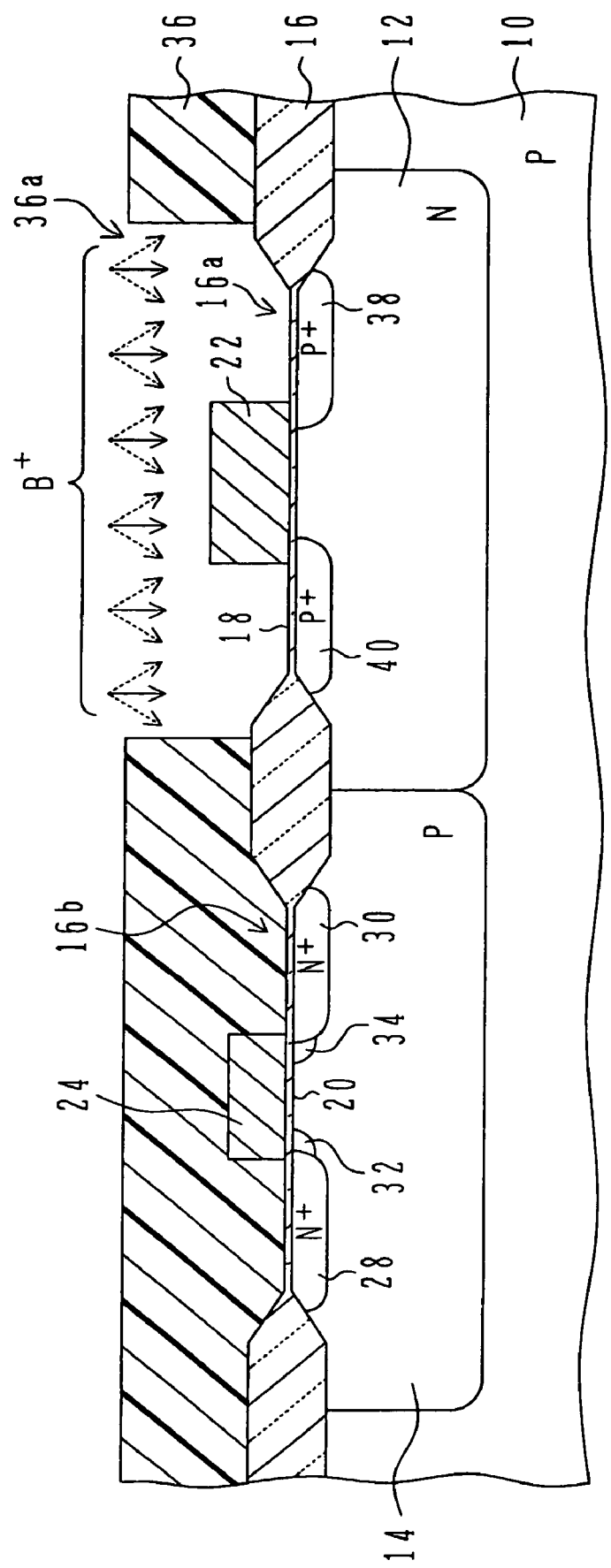
FIG. 16 is a cross sectional view illustrating a process of forming p$^+$-type source and drain regions, following the process of FIG. 15.

Next, in a process of FIG. 16, after a resist layer 36 is formed on the upper surface of the substrate, an ion implantation process is executed to form a p$^+$-type source region 38 and a p$^+$-type drain region 40. Namely, similar to the description made with reference to FIG. 5, by using as a mask the resist layer 36, a lamination of the gate electrode layer 22 and gate insulating film 18 and the field insulating film 16, boron (B) ions are implanted. As described with reference to FIG. 13 and indicated by broken-line arrows, it is preferable to implant ions obliquely to distribute the ions also under the gate electrode layer 24. The implantation conditions may be 50 keV, $4\times10^{15}$ cm$^{-2}$ and an inclination angle of 45 degrees when BF$_2$ are used as implanted impurities.

Figure 17:
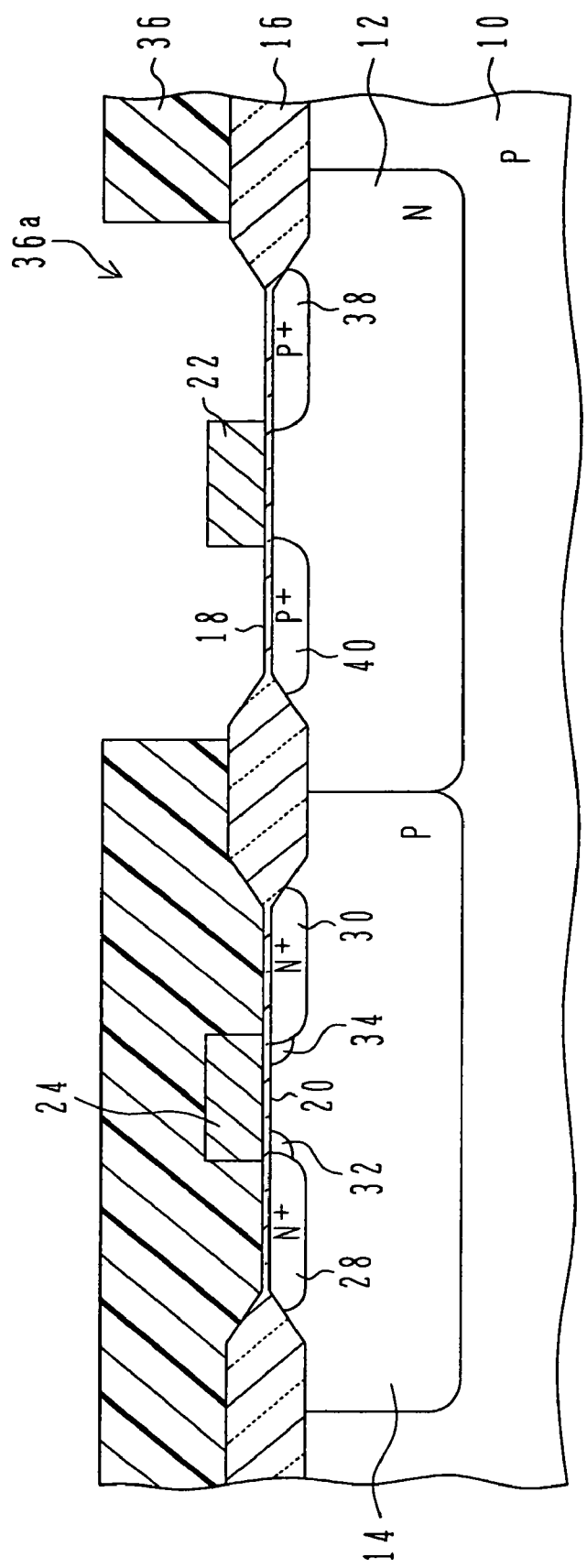
FIG. 17 is a cross sectional view illustrating a gate electrode etching process, following the process of FIG. 16.

Next, in a process of FIG. 17, an isotropic wet (or dry) etching process is executed by using the resist layer 36 as a mask to make the gate electrode layer 22 narrow and thin. The thickness and width of the gate electrode layer 22 can be set equal to the thickness and width of the gate electrode layer 24 described with reference to FIG. 14, respectively.

The resist layer 36 may be removed if desired to execute heat treatment. This heat treatment aims to diffuse and activate impurities diffused in a source region 38 and a drain region 40 and recover defects caused by ion implantation, and can be executed in an inert gas atmosphere. This heat treatment may be executed in an oxidizing atmosphere to form a thin silicon oxide film on the surface of the gate electrode layer 22.

With this heat treatment, the p$^+$-type source region 38 and p$^+$-type drain region 40 are formed extending from the regions on both sides of the gate electrode layer 22 toward regions under the gate electrode layer 22 and toward regions under the field insulating film 16. FIG. 17 shows the layout of the source region 38 and drain region 40. If the oblique ion implantation is executed, impurities are distributed easily under the gate electrode layer 22. Therefore, in the heat treatment, implanted impurities may only be activated without diffusion.

Figure 18:
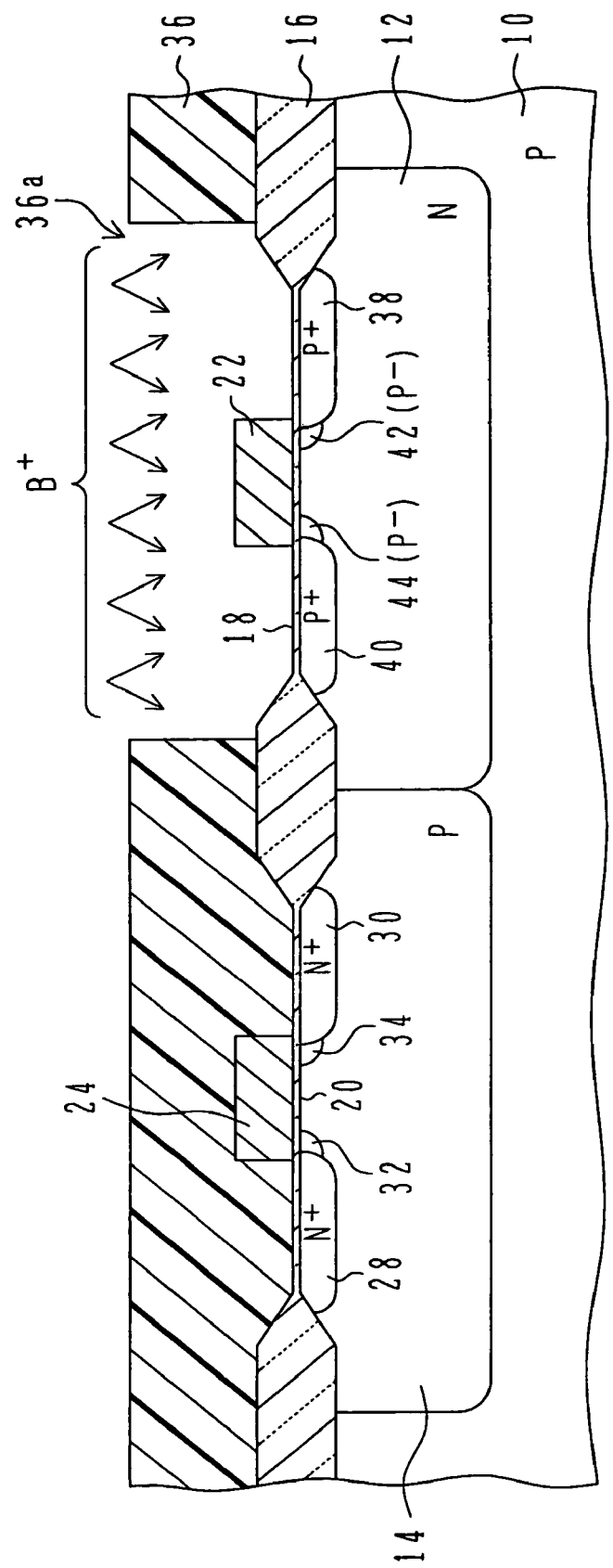
FIG. 18 is a cross sectional view illustrating a process of forming p$^-$-type source and drain regions, following the process of FIG. 17.

Next, in a process of FIG. 18, by using as a mask the resist layer 36, a lamination of the gate electrode layer 22 and gate insulating film 18 and the field insulating film 16, boron (B) ions are implanted to form a p$^-$-type source region 42 and a p$^-$-type drain region 44 in an n-type well 12 under the gate electrode layer 22 and adjacent to the p$^+$-type source region 38 and p$^+$-type drain region 40. In the ion implantation process, it is preferable to use the oblique ion implantation process which can distribute implanted impurities under the gate electrode.

Figure 19:
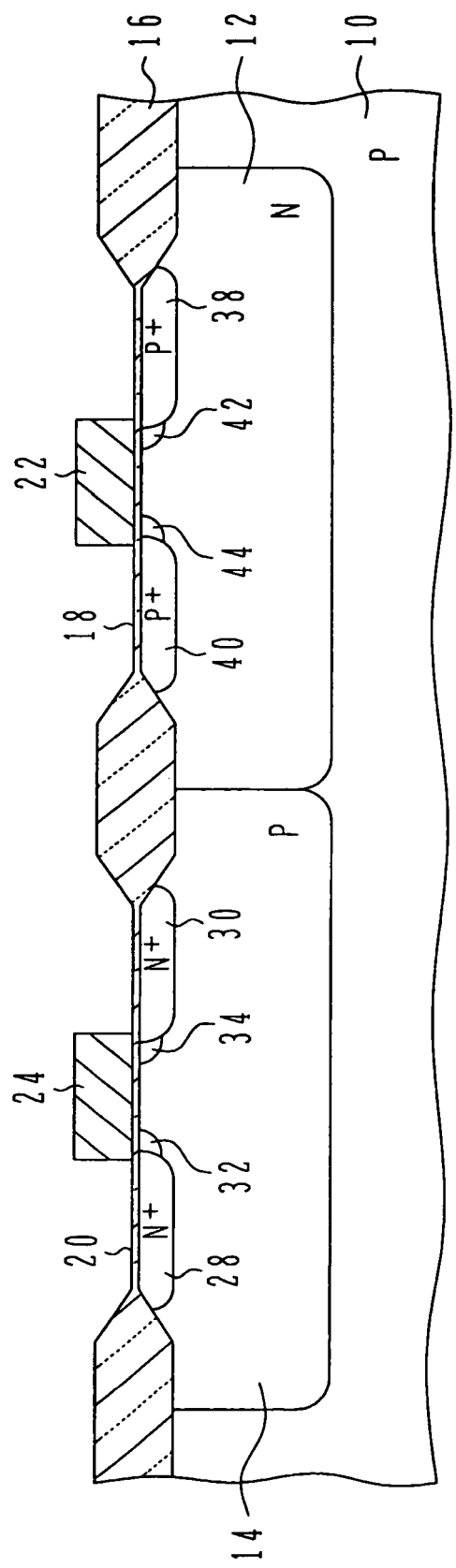
FIG. 19 is a cross sectional view illustrating a resist removing process, following the process of FIG. 18.

Next, in a process of FIG. 19, the resist layer 36 is removed by a well-known method. Heat treatment is executed to activate implanted impurities in the p$^+$-type regions 38 and 40 and p$^-$-type regions 42 and 44. Heat treatment is executed to activate implanted impurities in the n$^+$-type regions 28 and 30 and n$^-$-type regions 32 and 34. Implanted impurities in the n$^+$-type regions 28 and 30 and n$^-$-type regions 32 and 34 may be activated by this heat treatment. In this case, the heat treatment for activating implanted impurities described in the process of FIG. 15 can be omitted. With this heat treatment, the impurity diffusion in the n$^+$-type regions 28 and 30, n$^-$-type regions 32 and 34, p$^+$-type regions 38 and 40, p$^-$-type regions 42 and 44 may be controlled to realize the layout of the source/drain regions such as shown in FIG. 19.

Figure 9:
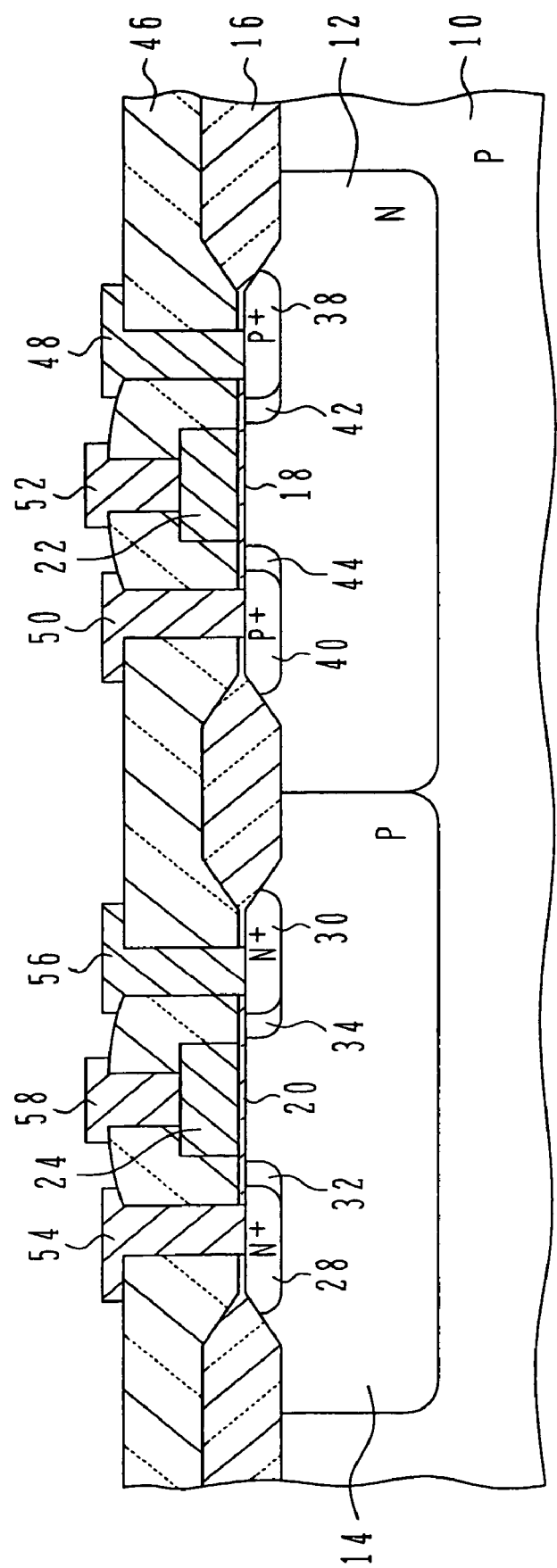
FIG. 9 is a cross sectional view illustrating an interlayer insulating film forming process and an electrode/wiring forming process, following the process of FIG. 8.
Figure 20:
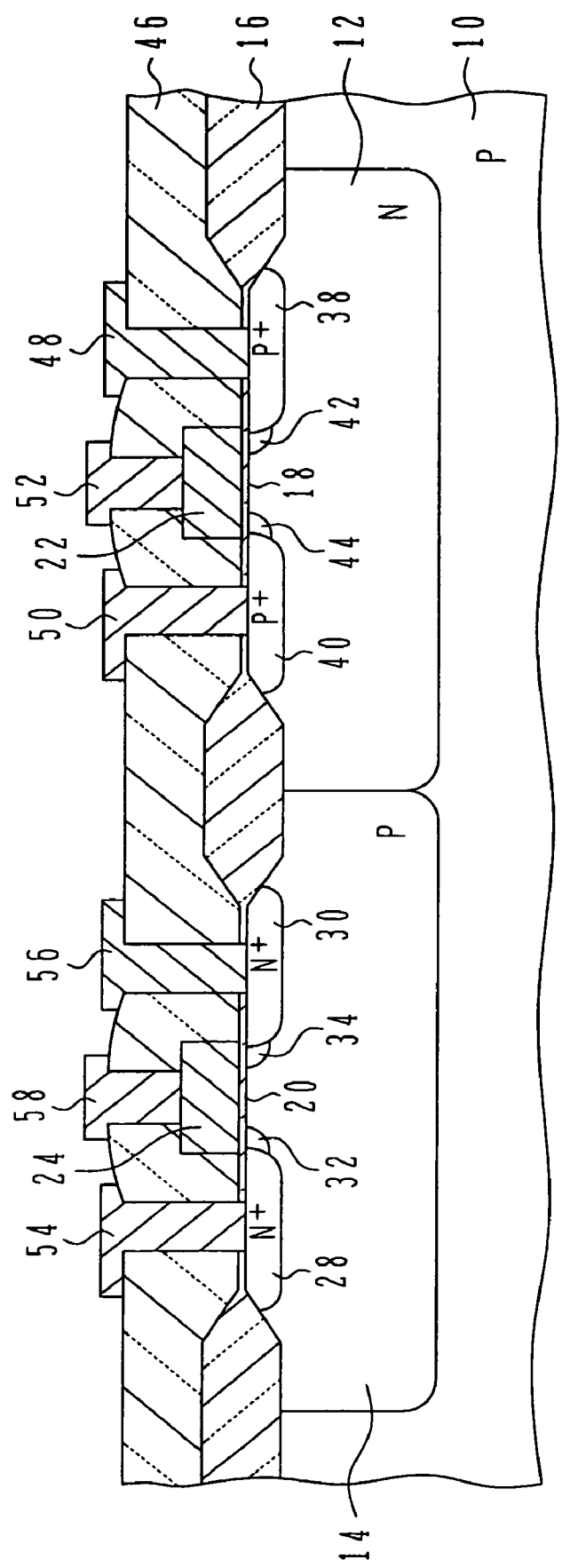
FIG. 20 is a cross sectional view illustrating an interlayer insulating film forming process and an electrode/wiring forming process, following the process of FIG. 19.

Thereafter, in a process of FIG. 20, similar to the description made with reference to FIG. 9, an interlayer insulating film 46 is formed, contact holes are formed through the insulating film 46, electrode layers 48, 50, 54 and 56 and wiring layers 52 and 58 are formed.

The embodiment described with reference to FIGS. 13 to 20 can provide the operation and effects similar to those of the embodiment described with reference to FIGS. 1 to 9 and in addition the following operation and effects. Namely, the oblique ion implantation process is used for forming the n$^+$-type source region 28 and n$^+$-type drain region 30 and the p$^+$-type source region 38 and p$^+$-type drain region 40. Therefore, all the n$^+$-type regions 28 and 30 and p$^+$-type regions 38 and 40 can be formed to have a small variation in depths and impurity concentrations. Since the drain regions 30 and 40 are formed extending under the gate electrode layers 24 and 22, respectively, a hot carrier life time is prolonged to delay the deterioration of transistor characteristics.

Furthermore, the oblique ion implantation process is used for forming the n$^-$-type source region 32 and n$^-$-type drain region 34 and the p$^-$-type source region 42 and p$^-$-type drain region 44. Therefore, all the source regions 32 and 42 and drain regions 34 and 44 can be formed to have a small variation in depths and impurity concentrations. Since the drain regions 34 and 44 are disposed under the gate electrodes 24 and 22 and adjacent to the drain regions 30 and 40, respectively, a transistor drive ability can be improved.

Figure 22:
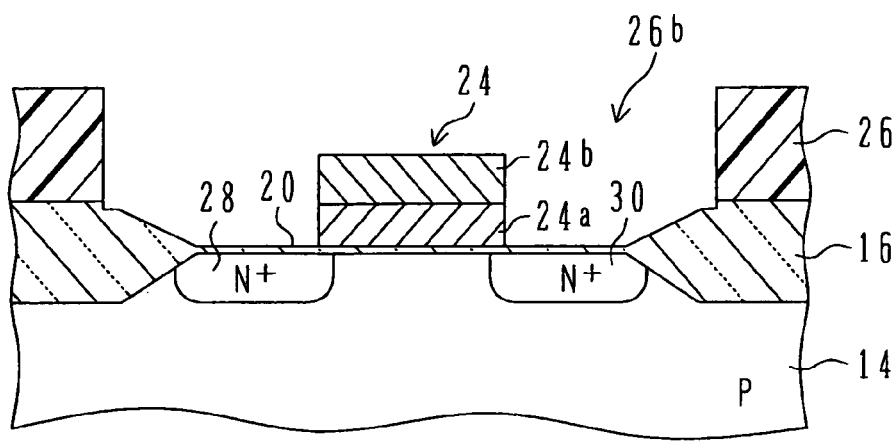
FIG. 22 is a cross sectional view illustrating a gate electrode forming process and an n$^+$-type source/drain region forming process in a polycide gate process according to a modification of the embodiment shown in FIGS. 13 to 20.
Figure 23:
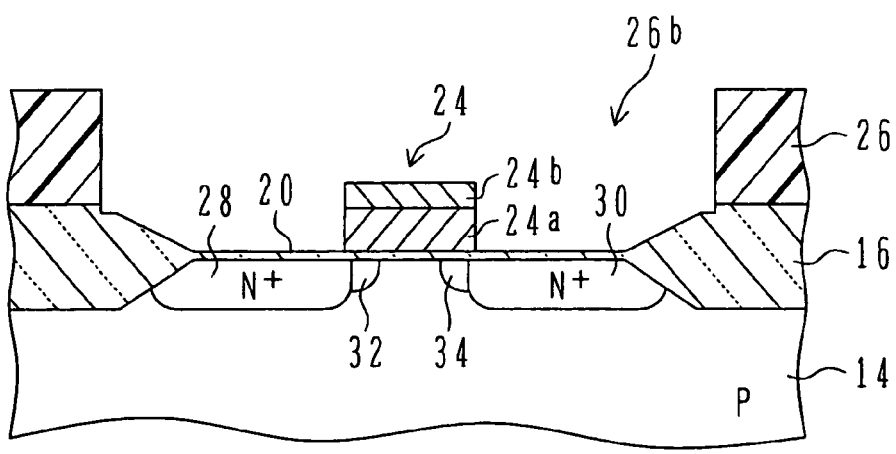
FIG. 23 is a cross sectional view illustrating a gate electrode etching process and an n$^-$-type source/drain region forming process, following the process of FIG. 22.

FIGS. 22 and 23 illustrate a polycide gate process according to a modification of the embodiment shown in FIGS. 13 to 20. Similar elements to those shown in FIGS. 13 to 20 are represented by identical reference symbols and the description thereof is omitted.

In a process of FIG. 22, similar to the description made with reference to FIG. 11, a gate electrode layer 24 is formed on a gate insulating film 20, the gate electrode being a lamination (polycide layer) of a polysilicon layer 24a and a silicide layer 24b. Similar to the description made with reference to FIG. 13, an ion implantation process is executed to form an n$^+$-type source region 28 and an n$^+$-type drain region 30. As described above, this ion implantation process is preferably the oblique ion implantation process.

In a process of FIG. 23, similar to the description made with reference to FIG. 12, an isotropic etching process is executed by using a resist layer 26 as a mask to make the gate electrode layer 24 narrow and thin. If desired, heat treatment is performed to form an n⁺-type source region 28 and an n⁺-type drain region 30 extending under the gate electrode layer 24.

Next, similar to the description made with reference to FIG. 15, an oblique ion implantation process is executed to form an n⁻-type source region 32 and an n⁻-type drain region 34. After the resist layer 26 is removed, heat treatment is performed to activate implanted impurities in the source regions 28 and 32 and drain regions 30 and 34. With this heat treatment, impurity diffusion in the source regions 28 and 32 and drain regions 30 and 34 may be controlled to realize the layout of the source/drain regions such as shown in FIG. 23.

Thereafter, processes corresponding to FIGS. 16 to 20 are executed. The gate electrode layer 22 is formed by patterning the polycide layer in the manner similar to the gate electrode 24 shown in FIG. 22 at the same time when the gate electrode layer 24 is formed. In the isotropic etching process of FIG. 17, the isotropic dry etching described with reference to FIG. 12 is executed. The other processes are executed in the manner similar to the description made with reference to FIGS. 16 to 20 to form a p-channel MOS type transistor having a polycide gate electrode.

The above-described CMOS type IC manufacture method according to the modification described with reference to FIGS. 22 and 23 can provide the operation and effects similar to those of the embodiment described with reference to FIGS. 13 to 20 and in addition can reduce the gate electrode resistance because the gate electrode layer is made of the polycide layer.

Figure 24:
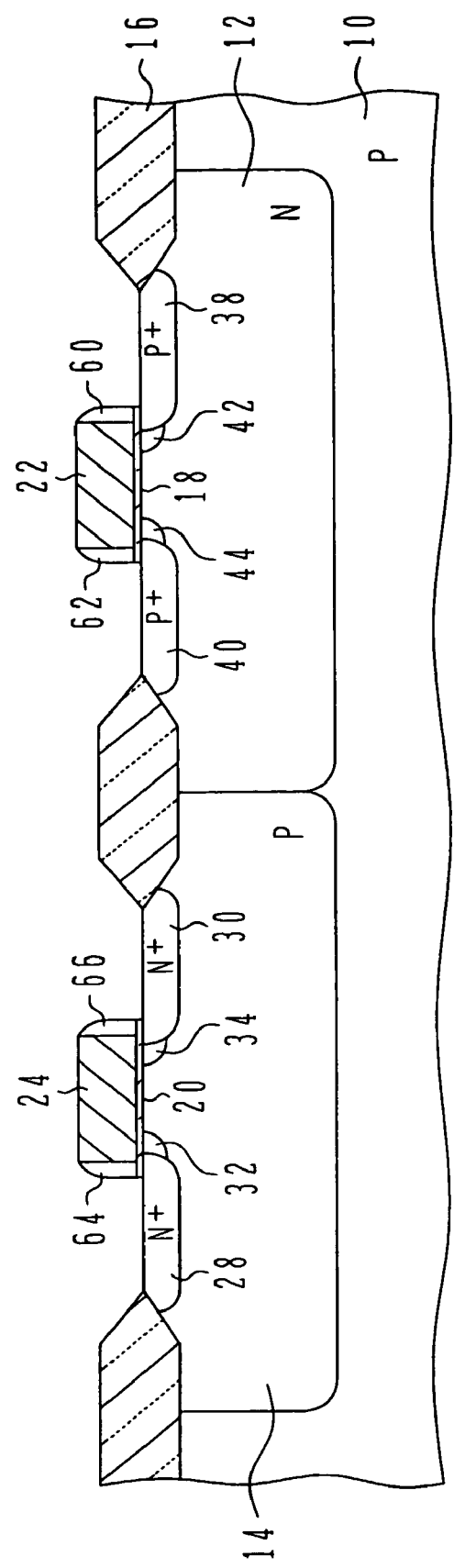
FIG. 24 is a cross sectional view illustrating a side spacer forming process in a salicide process according to still another embodiment of the present invention.

FIGS. 24 to 27 illustrate a salicide process according to still another embodiment of the present invention. Similar elements to those shown in FIGS. 13 to 20 are represented by identical reference symbols and the description thereof is omitted. A process of FIG. 24 is a side spacer forming process following the process of FIG. 19. In this embodiment, the same processes as those of the embodiment shown in FIGS. 13 to 19 are executed prior to the process of FIG. 24.

In the process of FIG. 24, after an insulating film is deposited on the upper surface of a substrate by CVD or the like, the deposited insulating film is etched back by an anisotropic dry etching process (e.g., a reactive ion etching (RIE) process) to form side spacers 60, 62, 64 and 66. The side spacers 60 and 62 are formed on the side walls of a gate electrode layer 22 and on partial surfaces of a gate insulating film 18. The side spacers 64 and 66 are formed on the side walls of a gate electrode layer 24 and on partial surfaces of a gate insulating film 20. The side spacers 60 to 66 are not used for forming LDD regions as in a conventional method, but they are used to protect the side walls of the gate electrode layers from silicidation and may be thin. As described earlier with reference to FIGS. 14 and 17, if thin oxide films are formed by thermally oxidizing the surfaces of the gate electrode layers 22 and 24, the thin silicon films on the upper surfaces of the gate electrode layers 22 and 24 are removed during the etch-back and the thin silicon films on the side walls of the gate electrode layers 22 and 24 may be used as portions of the side spacers.

In the dry etching process of FIG. 24, the gate insulating film 18 is removed leaving the gate insulating film 18 under the gate electrode layer 22 and side spacers 60 and 62, and the gate insulating film 20 is removed leaving the gate insulating film 20 under the gate electrode layer 24 and side spacers 64 and 66. In this case, the field insulating film 16 is slightly etched. With this dry etching, the p⁺-type source region 38 and p⁺-type drain region 40 are exposed, and the n⁺-type source region 28 and n⁺-type drain region 30 are exposed.

In the process of FIG. 24, for example, a silicon oxide film is deposited as the insulating film. In this case, an atmospheric pressure CVD system or a low pressure CVD system using TEOS and $O_3$ as source gas can be used. A deposition thickness of the silicon oxide film is set as desired in a range from 100 to 500 nm, for example, to 200 nm. In depositing a silicon oxide film, a high density plasma CVD system such as a plasma enhanced CVD system and an ECR plasma CVD system using TEOS and $O_3$ as source gas may be used.

The insulating film deposited in the process of FIG. 24 is not limited to the silicon oxide film, but a silicon nitride film or a silicon oxynitride film may also be used. Since the silicon nitride film or silicon oxynitride film has a dielectric constant higher than that of a silicon oxide film, it is effective for improving the characteristics of MOS type transistors and in addition it is suitable for a protective film for protecting the side walls of a gate electrode from silicidation.

Figure 25:
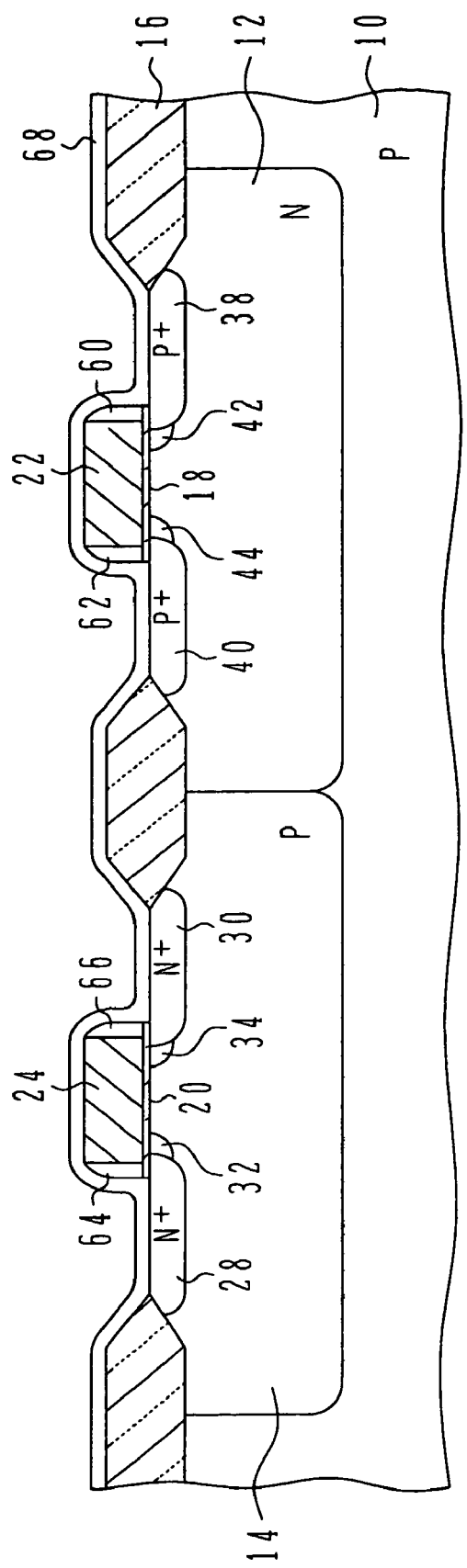
FIG. 25 is a cross sectional view illustrating a silicide forming metal deposition process, following the process of FIG. 24.

Next, in a process of FIG. 25, a silicide forming metal layer 68 is formed on the upper surface of the substrate, covering the field oxide film 16, n⁺-type regions 28 and 30, p⁺-type regions 38 and 40, gate electrode layers 22 and 24, gate insulating films 18 and 20 and side spacers 60 to 66. The substrate upper surface is cleaned prior to forming the metal layer 68. In this cleaning process, by using dilute hydrofluoric acid (500:1 DHF), a natural oxide film and the like on surfaces of the substrate silicon and gate polysilicon are removed.

As the metal layer 68, a titanium (Ti) layer may be used which has good affinity with the silicon gate process. The titanium layer can be deposited by sputtering or CVD. For example, a deposition thickness can be set as desired in a range from 5 to 100 nm (preferably from 20 to 35 nm), for example, to 25 nm.

The sputtering conditions for depositing the titanium layer may be:

DC power: 2 kW
RF power: 2.5 kW
substrate temperature: 200° C.

The material of the metal layer 68 may be refractory metal such as Mo, Ta, W, Hf and Zr, transition metal such as Co, Ni, Cr, Ir, Nb and Pt, noble metal, alloy of a plurality of these metals optionally selected, or the like. The transition metal Co, Ni or the like has a low silicidation temperature, is easy to react (re-diffusion of conductivity determining impurities are hard to occur in low temperature silicidation), and has a low silicide resistance.

Figure 26:
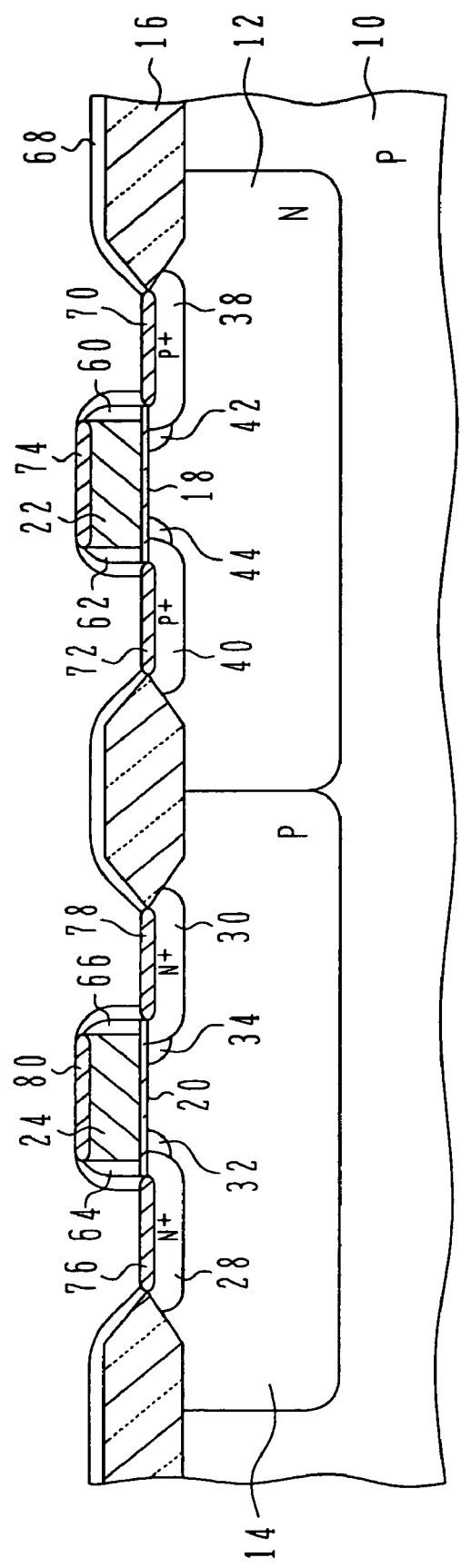
FIG. 26 is a cross sectional view illustrating a silicide forming process, following the process of FIG. 25.

In a process of FIG. 26, the titanium layer as the metal layer 68 is subjected to silicidation by heat treatment, with the p⁺-type regions 38 and 40, gate electrode layer 22, n⁺-type regions 28 and 30 and gate electrode layer 24 to thereby form silicide layers. Silicide layers 70, 72, 74, 76, 78 and 80 are therefore formed superposed upon the p⁺-type regions 38 and 40, gate electrode layer 22, n⁺-type regions 28 and 30 and gate electrode layer 24.

The heat treatment for silicidation may be a rapid thermal annealing (RTA) process. The heat treatment conditions may be an inert gas atmosphere of Ar or the like (or $N_2$ gas atmosphere), 450 to 900° C. and about 0.1 to 60 sec, for example, 800° C. and 25 sec.

Figure 27:
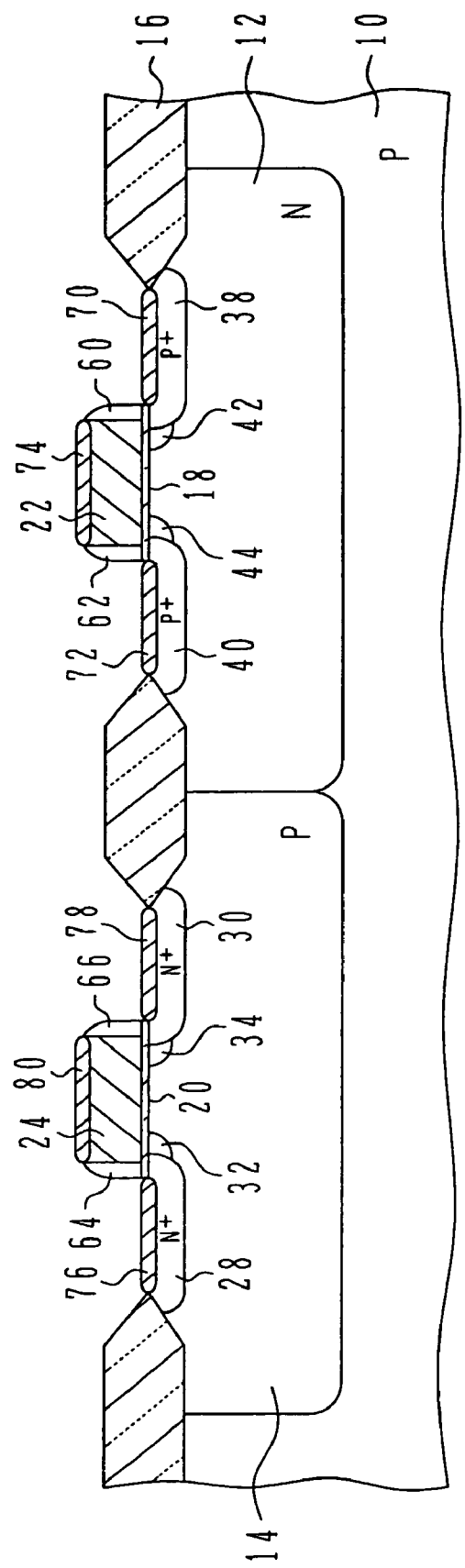
FIG. 27 is a cross sectional view illustrating an unreacted metal removing process, following the process of FIG. 26.

In a process of FIG. 27, an unreacted metal layer 68 is removed by a wet etching process using acid etchant ($H_2SO_4+H_2O_2$), and the silicide layers 70 to 80 are left.

The silicide layers 70 to 80 may be formed at two stages of silicidation. At the first stage, a silicidation reaction starts and progresses by relatively low temperature RTA at 500 to 750° C. (preferably 600 to 700° C.) for 20 to 40 sec (preferably 30 sec) and thereafter an unreacted titanium layer is removed. At the second stage the silicidation reaction progresses by relatively high temperature and short time RTA at 750 to 950° C. (preferably 850 to 900° C.) for 0.05 to 1 sec (preferably 0.1 to 0.5 sec) to perform phase transition from the silicide crystal phase to the low resistance $C_{54}$ phase. With this method, lower resistance silicide layers can be obtained. For the refractory metal Co or Ni, it is preferable that the first annealing is performed at a low temperature of 400 to 500° C. and the second annealing is performed at 550 to 700° C., because the resistance increases at a high temperature. This reason may be ascribed to aggregation of crystals or a change in crystal morphology.

After the process of FIG. 27, similar to the description made with reference to FIG. 9, an interlayer insulating film 46 is formed, contact holes are formed through the insulating film 46, electrode layers 48, 50, 54 and 56 and wiring layers 52 and 58 are formed. In this case, the source electrode layers 48 and 54 are connected to the silicide layers 70 and 76, respectively, the drain electrode layers 50 and 56 are connected to the silicide layers 72 and 78, respectively, and the gate wiring layers 52 and 58 are connected to the silicide layers 74 and 80, respectively.

The manufacture method described with reference to FIGS. 24 to 27 can provide the operation and effects similar to those of the embodiment described with reference to FIGS. 13 to 20 and in addition can reduce the resistance of the electrodes and wirings because the silicide layers 70 to 80 are formed. Since the silicide layers 70, 72, 76 and 78 are aligned in position with the side spacers 60, 62, 64 and 66, the manufacture yield can be improved.

In the manufacture method of FIGS. 24 to 27, as described earlier with reference to FIGS. 3 and 6, if thin oxide films are formed by thermally oxidizing the surfaces of the gate electrode layers 22 and 24, the thin silicon films on the upper surfaces of the gate electrode layers 22 and 24 are removed during the etch-back and the thin silicon films on the side walls of the gate electrode layers 22 and 24 may be used as portions of the side spacers. In this case, the RTA manufacture conditions such as a temperature and time are managed in such a manner that silicide formed on the source and drain regions during the silicidation will not creep up the gate electrode layers. A drive ability of transistors and the like are expected to be improved.

Figure 28:
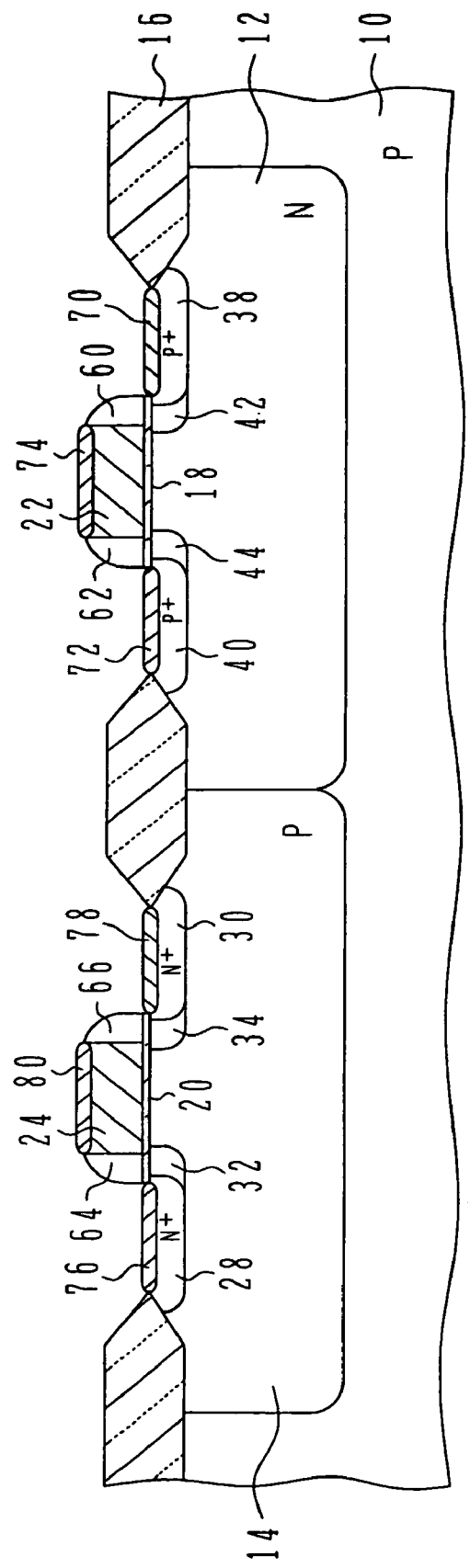
FIG. 28 is a cross sectional view illustrating a salicide process according to a first modification.
Figure 29:
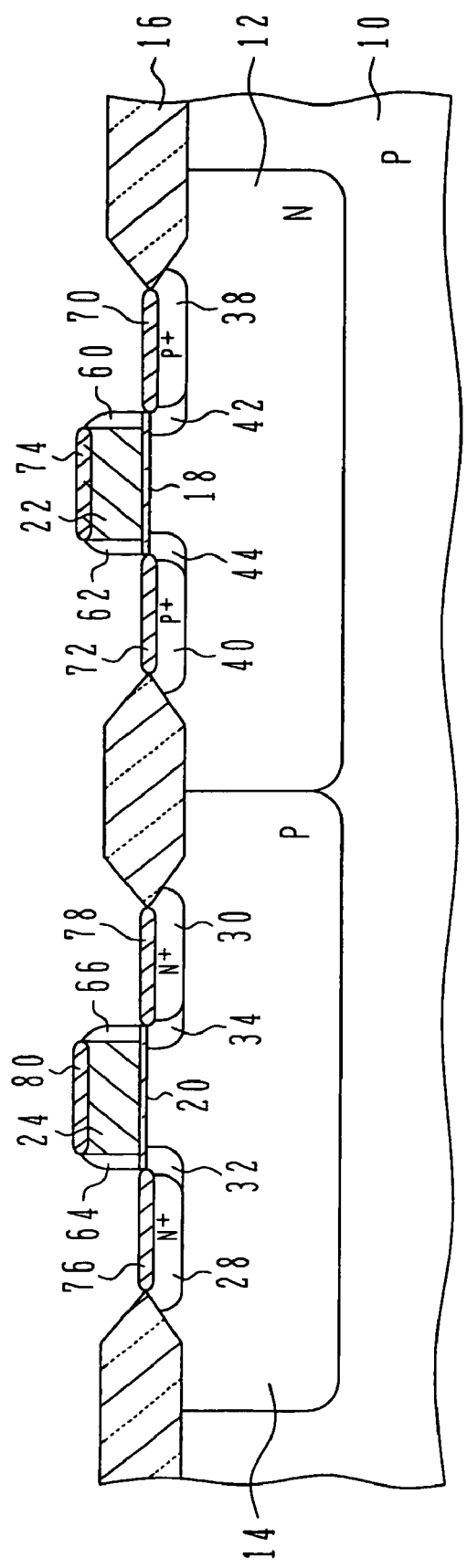
FIG. 29 is a cross sectional view illustrating a salicide process according to a second modification.
Figure 30:
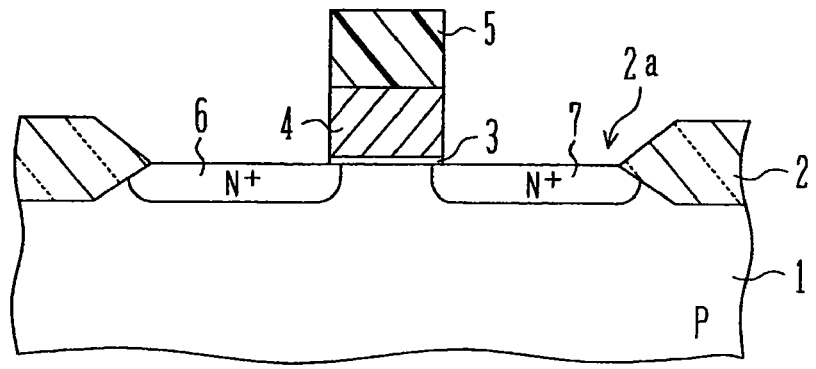
FIG. 30 is a cross sectional view illustrating an n$^+$-type source/drain region forming process in a conventional MOS type transistor manufacture method.
Figure 31:
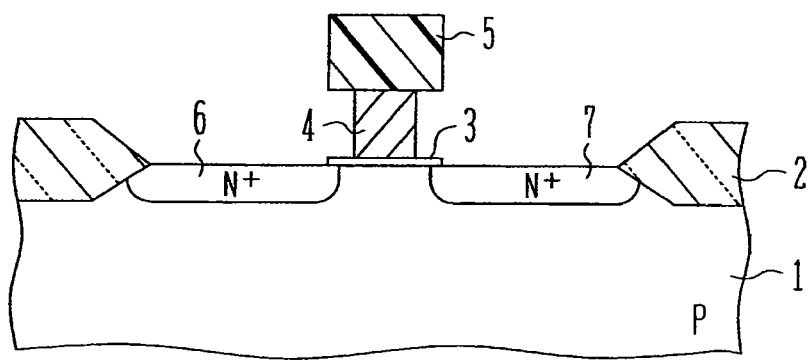
FIG. 31 is a cross sectional view illustrating a gate electrode etching process, following the process of FIG. 30.
Figure 32:
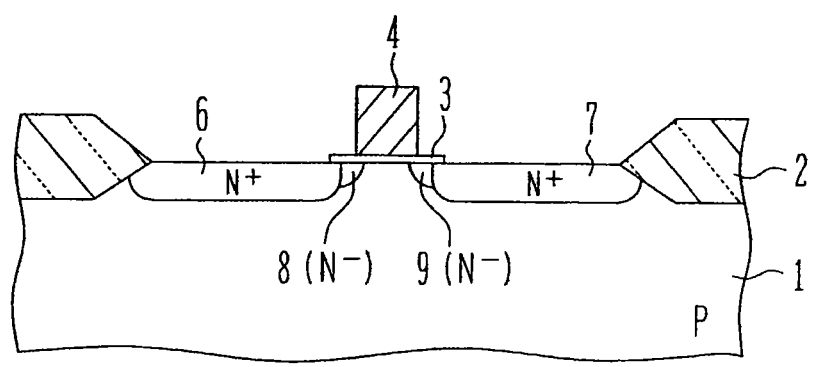
FIG. 32 is a cross sectional view illustrating an n$^-$-type source/drain region forming process, following the process of FIG. 31.

FIGS. 28 and 29 illustrate first and second modifications of a salicide process. In FIGS. 28 and 29, similar elements to those shown in FIGS. 24 to 27 are represented by identical reference symbols and the description thereof is omitted. In FIGS. 28 and 29, after the resist removal process of FIG. 8, side spacers 60 to 66 are formed in a manner similar to the description made with reference to FIG. 24, and silicide layers 70 to 80 are formed in a manner similar to the description made with reference to FIGS. 25 to 27.

In the modification of FIG. 28, side spacers 60 and 64 are formed relatively thick so that silicide layers 70 and 76 are disposed in source regions 38 and 28, respectively, and side spacers 62 and 66 are formed relatively thick so that silicide layers 72 and 78 are disposed in drain regions 40 and 30, respectively. Since the side spacers are thick, silicide formed on the source and drain regions during the silicidation process is hard to creep up the gate electrode layers. It is therefore possible to suppress the generation of short defects between the gate electrode and the source/drain regions. There is some degree of freedom in the management of an annealing temperature and time so that a process margin can be improved.

In the modification of FIG. 29, side spacers 60 and 64 are formed relatively thin so that silicide layers 70 and 76 are disposed in source regions 38 and 28 and slightly overlapped with source regions 42 and 32, respectively, and side spacers 62 and 66 are formed relatively thin so that silicide layers 72 and 78 are disposed in source regions 40 and 30 and slightly overlapped with drain regions 40 and 302, respectively. A transistor drive ability and an alignment margin of contacts can therefore be improved.

The modifications of FIGS. 28 and 29 can provide the operation and effects similar to those of the manufacture method described with reference to FIGS. 1 to 9 and in addition can reduce the resistance of the electrodes and wirings because the silicide layers 70 to 80 are formed. Since the silicide layers 70, 72, 76 and 78 are aligned in position with the side spacers 60, 62, 64 and 66, the manufacture yield can be improved.

The present invention has been described in connection with the preferred embodiments. The invention is not limited only to the above embodiments. It will be apparent to those skilled in the art that other various modifications, improvements, combinations, and the like can be made.

What we claim are:

1. A method of manufacturing an insulated gate type field effect transistor comprising steps of:
   (a) preparing a semiconductor substrate having at least a region of a first conductivity type on a side of one principal surface;
   (b) forming a field insulating film on the one principal surface of said semiconductor substrate, said field insulating film having an element opening corresponding to said region;
   (c) forming a gate insulating film on a semiconductor surface in said element opening;
   (d) forming a gate electrode layer on said gate insulating film;
   (e) forming high impurity concentration source and drain regions of a second conductivity type opposite to the first conductivity type in said first conductivity type region on both sides of said gate electrode layer, by an impurity doping process using as an impurity mask a lamination of said gate electrode layer and said gate insulating film, and said field insulating film;
   (f) etching an upper surface and side walls of said gate electrode layer by an isotropic etching process to make said gate electrode layer narrow and thin; and
   (g) forming low impurity concentration source and drain regions of the second conductivity type in said first conductivity type region on both sides of said gate electrode layer and adjacent to said high impurity concentration source region and drain region, by an impurity doping process using as an impurity mask a lamination of said narrow and thin gate electrode layer and said gate insulating film, and said field insulating film,
   wherein the gate electrode layer is a polycide structure, the polycide-structured gate electrode layer being isotropically-etched to be narrow and thin and used as a mask.

2. The method of manufacturing an insulated gate type field effect transistor according to claim 1, wherein said impurity doping process in said step (e) implants impurity ions via said gate insulating film into said first conductivity type region on both side of said gate electrode layer.

3. The method of manufacturing an insulated gate type field effect transistor according to claim 1, wherein said high impurity concentration source and drain regions are formed extending from regions on both sides of said gate electrode layer to regions under said gate electrode layer, and said low impurity concentration source and drain regions are disposed under said gate electrode layer and adjacent to said high impurity concentration source and drain regions.

4. A method of manufacturing an insulated gate type field effect transistor comprising steps of:
   (a) preparing a semiconductor substrate having at least a region of a first conductivity type on a side of one principal surface;
   (b) forming a field insulating film on the one principal surface of said semiconductor substrate, said field insulating film having an element opening corresponding to said region;
   (c) forming a gate insulating film on a semiconductor surface in said element opening;
   (d) forming a gate electrode layer on said gate insulating film;
   (e) forming source and drain regions of a second conductivity type opposite to the first conductivity type in said first conductivity type region on both sides of said gate electrode layer, by an impurity doping process using as an impurity mask a lamination of said gate electrode layer and said gate insulating film, and said field insulating film;
   (f) etching an upper surface and side walls of said gate electrode layer by an isotropic etching process to make said gate electrode layer narrow and thin;
   (g) after said gate electrode layer is made narrow and thin, forming first and second insulating side spacers covering side walls of said gate electrode layer on said gate insulating film, and removing said gate insulating film excepting said gate insulating film under said gate electrode layer and said first and second insulating side spacers to expose said source and drain regions;
   (h) forming a silicide forming metal layer covering said gate electrode layer, said first and second insulating side spacers, said gate insulating film, said source region and said drain region; and
   (i) silicidating said silicide forming metal layer with said gate electrode layer, said source region and said drain region, by heat treatment and thereafter removing an unreacted silicide forming metal layer to form a first silicide layer on said gate electrode layer, a second silicide layer on said source region and a third silicide layer on said drain region,
   wherein the silicide layer is formed so as to cover all the surfaces of the gate electrode, the source, and drain regions.

5. The method of manufacturing an insulated gate type field effect transistor according to claim 4, wherein said source region and said drain region have a high impurity concentration and extend from regions on both sides of said gate electrode layer toward regions under said gate electrode layer, and after said gate electrode layer is made narrow and thin and before said first and second insulating side spacers are formed, low impurity concentration source and drain regions of a second conductivity type are formed in said first conductivity type region on both sides of said gate electrode layer under said gate electrode layer and adjacent to said source region and said drain region, by an impurity doping process using as an impurity mask a lamination of said gate electrode layer and said gate insulating film, and said field insulating film.

6. A method of manufacturing an insulated gate type field effect transistor comprising steps of:
   (a) preparing a semiconductor substrate having a first region of a first conductivity type on a side of one principal surface and a second region of a second conductivity type opposite to the first conductivity type on the side of the one principal surface;
   (b) forming a field insulating film on the one principal surface of said semiconductor substrate, said field insulating film having first and second element openings corresponding to said first and second regions;
   (c) forming first and second gate insulating films on a semiconductor surface in said first and second element openings;
   (d) forming first and second gate electrode layers on said first and second gate insulating films;
   (e) forming a first resist layer on said field insulating film, said first resist layer exposing said first element opening and covering said second element opening;
   (f) forming high impurity concentration first source and drain regions of the second conductivity type in said first conductivity type region on both sides of said first gate electrode layer, by an impurity doping process using as an impurity mask said first resist layer, a lamination of said first gate electrode layer and said first gate insulating film, and said field insulating film;
   (g) etching an upper surface and side walls of said first gate electrode layer by an isotropic etching process using said first resist layer as an etching mask to make said first gate electrode layer narrow and thin;
   (h) forming low impurity concentration second source and drain regions of the second conductivity type in said first conductivity type region on both sides of said first gate electrode layer and adjacent to said first source region and said first drain region, by an impurity doping process using as an impurity mask said first resist layer, a lamination of said narrow and thin first gate electrode layer and said first gate insulating film, and said field insulating film;
   (i) after said first resist layer is removed, forming a second resist layer on said field insulating film, said second resist layer exposing said second element opening and covering said first element opening;
   (j) forming high impurity concentration third source and drain regions of the first conductivity type in said second conductivity type region on both sides of said second gate electrode layer, by an impurity doping process using as an impurity mask said second resist layer, a lamination of said second gate electrode layer and said second gate insulating film, and said field insulating film;
   (k) etching an upper surface and side walls of said second gate electrode layer by an isotropic etching process using said second resist layer as an etching mask to make said second gate electrode layer narrow and thin;
   (l) forming low impurity concentration fourth source and drain regions of the first conductivity type in said second conductivity type region on both sides of said second gate electrode layer and adjacent to said third source region and said third drain region, by an impurity doping process using as an impurity mask said second resist layer, a lamination of said narrow and thin second gate electrode layer and said second gate insulating film, and said field insulating film; and
   (m) removing said second resist layer,
   wherein in said steps (g) and (k), different etching amounts are used in said isotropic etching processes to make said first and second gate electrode layers have different widths and thicknesses.

7. The method of manufacturing an insulated gate type field effect transistor according to claim 6, wherein said first source and drain regions are formed extending from regions on both sides of said first gate electrode layer to regions under said first gate electrode layer, said second source and drain regions are disposed under said first gate electrode layer and adjacent to said first source and drain regions, said third source and drain regions are formed extending from regions on both sides of said second gate electrode layer to regions under said second gate electrode layer, and said fourth source and drain regions are disposed under said second gate electrode layer and adjacent to said third source and drain regions.

8. A method of manufacturing an insulated gate type field effect transistor comprising steps of:
(a) preparing a semiconductor substrate having a first region of a first conductivity type on a side of one principal surface and a second region of a second conductivity type opposite to the first conductivity type on the side of the one principal surface;
(b) forming a field insulating film on the one principal surface of said semiconductor substrate, said field insulating film having first and second element openings corresponding to said first and second regions;
(c) forming first and second gate insulating films on a semiconductor surface in said first and second element openings;
(d) forming first and second gate electrode layers on said first and second gate insulating films;
(e) forming a first resist layer on said field insulating film, said first resist layer exposing said first element opening and covering said second element opening;
(f) forming high impurity concentration first source and drain regions of the second conductivity type in said first conductivity type region on both sides of said first gate electrode layer, by an impurity doping process using as an impurity mask said first resist layer, a lamination of said first gate electrode layer and said first gate insulating film, and said field insulating film;
(g) etching an upper surface and side walls of said first gate electrode layer by an isotropic etching process using said first resist layer as an etching mask to make said first gate electrode layer narrow and thin;
(h) forming low impurity concentration second source and drain regions of the second conductivity type in said first conductivity type region on both sides of said first gate electrode layer and adjacent to said first source region and said first drain region, by an impurity doping process using as an impurity mask said first resist layer, a lamination of said narrow and thin first gate electrode layer and said first gate insulating film, and said field insulating film;
(i) after said first resist layer is removed, forming a second resist layer on said field insulating film, said second resist layer exposing said second element opening and covering said first element opening;
(j) forming high impurity concentration third source and drain regions of the first conductivity type in said second conductivity type region on both sides of said second gate electrode layer, by an impurity doping process using as an impurity mask said second resist layer, a lamination of said second gate electrode layer and said second gate insulating film, and said field insulating film;
(k) etching an upper surface and side walls of said second gate electrode layer by an isotropic etching process using said second resist layer as an etching mask to make said second gate electrode layer narrow and thin;
(l) forming low impurity concentration fourth source and drain regions of the first conductivity type in said second conductivity type region on both sides of said second gate electrode layer and adjacent to said third source region and said third drain region, by an impurity doping process using as an impurity mask said second resist layer, a lamination of said narrow and thin second gate electrode layer and said second gate insulating film, and said field insulating film;
(m) removing said second resist layer; and
further comprising steps of:
(n) after said second resist layer is removed, forming first and second insulating side spacers covering side walls of said first gate electrode layer on said first gate insulating film, forming third and fourth insulating side spacers covering side walls of said second gate electrode layer on said second gate insulating film, removing said first gate insulating film excepting said first gate insulating film under said first gate electrode layer and said first and second insulating side spacers, and removing said second gate insulating film excepting said second gate insulating film under said second gate electrode layer and said third and fourth insulating side spacers, to thereby expose said first and third source regions and said first and third drain regions;
(o) forming a silicide forming metal layer covering said first and second gate electrode layers, said first to fourth insulating side spacers, said first and second gate insulating films, said first and third source regions and said first and third drain regions; and
(p) silicidating said silicide forming metal layer with said first and second gate electrode layers, said first and third source regions and said first and third drain regions, by heat treatment and thereafter removing an unreacted silicide forming metal layer to form first and second silicide layers on said first and second gate electrode layers, third and fourth silicide layers on said first and third source regions, and fifth and sixth silicide layers on said first and third drain regions.

9. A method of manufacturing an insulated gate type field effect transistor comprising steps of:
(a) preparing a semiconductor substrate having a first region of a first conductivity type on a side of one principal surface and a second region of a second conductivity type opposite to the first conductivity type on the side of the one principal surface;
(b) forming a field insulating film on the one principal surface of said semiconductor substrate, said field insulating film having first and second element openings corresponding to said first and second regions;
(c) forming first and second gate insulating films on a semiconductor surface in said first and second element openings;
(d) forming first and second gate electrode layers on said first and second gate insulating films;
(e) forming a first resist layer on said field insulating film, said first resist layer exposing said first element opening and covering said second element opening;
(f) forming high impurity concentration first source and drain regions of the second conductivity type in said first conductivity type region on both sides of said first gate electrode layer, by an impurity doping process using as an impurity mask said first resist layer, a lamination of said first gate electrode layer and said first gate insulating film, and said field insulating film;

(g) etching an upper surface and side walls of said first gate electrode layer by an isotropic etching process using said first resist layer as an etching mask to make said first gate electrode layer narrow and thin;

(h) forming low impurity concentration second source and drain regions of the second conductivity type in said first conductivity type region on both sides of said first gate electrode layer and adjacent to said first source region and said first drain region, by an impurity doping process using as an impurity mask said first resist layer, a lamination of said narrow and thin first gate electrode layer and said first gate insulating film, and said field insulating film;

(i) after said first resist layer is removed, forming a second resist layer on said field insulating film, said second resist layer exposing said second element opening and covering said first element opening;

(j) forming high impurity concentration third source and drain regions of the first conductivity type in said second conductivity type region on both sides of said second gate electrode layer, by an impurity doping process using as an impurity mask said second resist layer, a lamination of said second gate electrode layer and said second gate insulating film, and said field insulating film;

(k) etching an upper surface and side walls of said second gate electrode layer by an isotropic etching process using said second resist layer as an etching mask to make said second gate electrode layer narrow and thin;

(l) forming low impurity concentration fourth source and drain regions of the first conductivity type in said second conductivity type region on both sides of said second gate electrode layer and adjacent to said third source region and said third drain region, by an impurity doping process using as an impurity mask said second resist layer, a lamination of said narrow and thin second gate electrode layer and said second gate insulating film, and said field insulating film; and (m) removing said second resist layer;

wherein the gate electrode layer has a polycide structure, the polycide-structured gate electrode layer being isotropically-etched to be narrow and thin and used as a mask.

* * * * *